United States Patent
Jeong et al.

(10) Patent No.: US 8,334,148 B2
(45) Date of Patent: Dec. 18, 2012

(54) METHODS OF FORMING PATTERN STRUCTURES

(75) Inventors: Jun-Ho Jeong, Suwon-si (KR); Jang-Eun Lee, Suwon-si (KR); Woo-Jin Kim, Yongin-si (KR); Hee-Ju Shin, Yongin-si (KR); Yong-Hwan Ryu, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/184,127

(22) Filed: Jul. 15, 2011

(65) Prior Publication Data

US 2011/0272380 A1 Nov. 10, 2011

Related U.S. Application Data

(63) Continuation-in-part of application No. 12/940,535, filed on Nov. 5, 2010, now Pat. No. 8,158,445.

(30) Foreign Application Priority Data

Nov. 11, 2009 (KR) .................. 10-2009-0108712
Jan. 19, 2010 (KR) .................. 10-2010-0004570
Jul. 16, 2010 (KR) .................. 10-2010-0069071

(51) Int. Cl.
*H01L 21/00* (2006.01)

(52) U.S. Cl. .................. 438/3; 257/E21.665
(58) Field of Classification Search .......... 257/E21.665; 438/3
See application file for complete search history.

(56) References Cited

U.S. PATENT DOCUMENTS

| 6,831,019 | B1 | 12/2004 | Li et al. |
| 7,105,361 | B2* | 9/2006 | Chen et al. ............ 438/3 |
| 2004/0129361 | A1* | 7/2004 | Chen et al. ............ 156/58 |
| 2005/0026430 | A1* | 2/2005 | Kim et al. ............ 438/689 |
| 2010/0018947 | A1 | 1/2010 | Kimura et al. |
| 2010/0032642 | A1 | 2/2010 | Park et al. |
| 2010/0084372 | A1 | 4/2010 | Taniguchi |
| 2010/0112728 | A1* | 5/2010 | Korzenski et al. ........ 438/3 |
| 2010/0117074 | A1 | 5/2010 | Yamazaki et al. |
| 2010/0264500 | A1 | 10/2010 | Zhu |
| 2011/0079918 | A1* | 4/2011 | Zhou et al. ............ 257/774 |
| 2011/0111532 | A1* | 5/2011 | Ryu et al. ............ 438/3 |
| 2012/0077347 | A1* | 3/2012 | Metz et al. ............ 438/715 |

FOREIGN PATENT DOCUMENTS

JP 2002038285 A 2/2002

(Continued)

OTHER PUBLICATIONS

Office Action for U.S. Appl. No. 12/940,535, dated May 10, 2011. US Office Action, dated Oct. 14, 2011, issued in related U.S. Appl. No. 12/940,535.

*Primary Examiner* — Thao P. Le
(74) *Attorney, Agent, or Firm* — Harness, Dickey & Pierce P.L.C.

(57) ABSTRACT

An example embodiment relates to a method of forming a pattern structure, including forming an object layer on a substrate, and forming a hard mask on the object layer. A plasma reactive etching process is performed on the object layer using an etching gas including a fluorine containing gas and ammonia ($NH_3$) gas together with oxygen gas to form a pattern. The oxygen gas is used for suppressing the removal of the hard mask during the etching process.

13 Claims, 18 Drawing Sheets

FOREIGN PATENT DOCUMENTS

| | | |
|---|---|---|
| JP | 2004356179 A | 12/2004 |
| JP | 2006060172 A | 3/2006 |
| JP | 2006278457 A | 10/2006 |
| JP | 2008226922 A | 9/2008 |
| KR | 20050111469 | 11/2005 |
| KR | 20060079455 A | 7/2006 |
| KR | 20060109718 A | 10/2006 |
| KR | 20070081752 A | 8/2007 |
| KR | 10-0719345 | 11/2007 |

* cited by examiner

1ST DIRECTION
⊗ ⟶ 2ND DIRECTION

1ST DIRECTION
⊗ ⟶ 2ND DIRECTION

METHODS OF FORMING PATTERN STRUCTURES

CROSS-REFERENCE TO RELATED APPLICATIONS

This application is a Continuation-In-Part Application claiming priority under 35 U.S.C. §120 of U.S. patent application Ser. No. 12/940,535, filed on Nov. 5, 2010 now U.S. Pat. No. 8,158,445, which claims priority under 35 U.S.C. §119 to Korean Patent Application Nos. 10-2009-0108712 and 10-2010-0004570, filed on Nov. 11, 2009 and Jan. 19, 2010, respectively, in the Korean Intellectual Property Office (KIPO). This application also claims priority under 35 U.S.C. §119 to the benefit of Korean Patent Application No. 10-2010-0069071, filed on Jul. 16, 2010, in the Korean Intellectual Property Office. The entire contents of each of the above-mentioned applications are incorporated herein by reference.

BACKGROUND

1. Field

Example embodiments relate to pattern structures, methods of forming the same and methods of manufacturing semiconductor devices using the same. More particularly, example embodiments relate to pattern structures including a magnetic or a phase change material, methods of forming the same, and methods of manufacturing semiconductor devices using the same.

2. Description of the Related Art

Magnetic memory devices and a phase change memory devices are non-volatile memory devices that may have high speed read/write operation. They are expected to be developed as the next generation memory devices.

The magnetic memory device may include a magnetic metal. The phase change memory device may include a phase change metal that contains at least two components. The metal used in the memory devices may be patterned by a reactive etching process or a physical etching process; however, an etching rate for the metal may be very low. Additionally, a hard mask for the etching process having a high etching selectivity may not be easily formed. Specifically, the hard mask may be excessively removed during the etching process so that structures below the hard mask may not be patterned into a desirable shape. Therefore, a suitable etching process for patterning the metal used for the memory devices in which pattern structures may have a vertical sidewall is needed.

SUMMARY

Example embodiments relate to a pattern structure including magnetic or phase change material.

Example embodiments relate to a method of forming the pattern structure.

Example embodiments relate to a method of manufacturing a memory device having good operational characteristics for reducing process defects.

According to example embodiments, a method of forming a pattern structure includes forming a magnetic layer on a substrate, the magnetic layer including at least one magnetic material. A hard mask including a metal may be formed on the magnetic layer. A plasma reactive etching process may be performed on the magnetic layer using an etching gas including a fluorine containing gas, ammonia ($NH_3$), and oxygen gas to form a magnetic pattern. The oxygen gas may be used for suppressing the removal of the hard mask during the etching process.

In example embodiments, the magnetic layer may include an alloy of at least two of cobalt (Co), iron (Fe), terbium (Tb), ruthenium (Ru), palladium (Pd), platinum (Pt) and manganese (Mn), and combinations thereof.

In example embodiments, the fluorine containing gas may include sulfur hexafluoride ($SF_6$), nitrogen trifluoride ($NF_3$), silicon tetrafluoride ($SiF_4$), carbon tetrafluoride ($CF_4$), and combinations thereof.

In example embodiments, a flow rate of the ammonia gas may be equal to or greater than a flow rate of the fluorine containing gas.

In example embodiments, a flow rate ratio between the fluorine containing gas and the ammonia gas may be in a range of about 1:1 to about 1:50.

In example embodiments, a flow rate of the oxygen gas may be less than about 10% of a flow rate of the ammonia gas.

In example embodiments, the oxygen gas may be provided at a flow rate of about 10 sccm to about 100 sccm.

In example embodiments, the hard mask may include at least one of titanium, titanium nitride, tantalum, tantalum nitride, tungsten, tungsten nitride, and combinations thereof.

In example embodiments, a metal oxide layer may be foiled on a surface of the hard mask during the etching process.

In example embodiments, a subsequent process may be performed in which oxygen gas is provided, after performing the plasma reactive etching process.

In example embodiments, the magnetic pattern may be formed to have a line width of about 30 nm to about 100 nm.

In example embodiments, the plasma reactive etching process may be performed at a temperature of about 10° C. to about 300° C. and under a pressure of about 1 mTorr to about 10 mTorr.

In example embodiments, a flow rate of the oxygen gas may be adjusted so that a surface of the hard mask may be oxidized during the etching process and the oxygen process does not hinder the etching of the magnetic layer.

According to example embodiments, a method of manufacturing a semiconductor device includes forming a conductive pattern on a substrate. The method may include forming a lower magnetic layer, a tunnel barrier layer, and an upper magnetic layer on the conductive pattern. A hard mask may be formed on the upper magnetic layer. The upper magnetic layer, the tunnel barrier layer and the lower magnetic layer may be partially etched by a plasma reactive etching process using a mixed etching gas including a fluorine containing gas and ammonia ($NH_3$) gas together with oxygen gas to form a Magnetic Tunnel Junction (MTJ) structure. The oxygen gas may be used for suppressing a removal of the hard mask during the etching process In example embodiments, a flow rate of the ammonia gas may be equal to or greater than a flow rate of the fluorine containing gas in the mixed etching gas.

According to example embodiments, a method of forming a patterned object layer includes forming an object layer on a substrate. The method may further include forming a mask pattern on the object layer, and performing an etching process using a mixed etching gas including at least ammonia gas and oxygen gas to form a patterned object layer. The oxygen gas may suppress the removal of the mask pattern during the etching process.

In example embodiments, the object layer may include a magnetic material, and the mixed etching gas may include a fluorine-containing gas.

In example embodiments, the object layer may include a phase change material. The mixed etching gas may further include one of an inert gas, carbon tetrafluoride ($CF_4$), carbon monoxide (CO), hydrogen bromide (HBr), sulfur hexafluoride ($SF_6$), and combinations thereof.

In example embodiments, the method may be used to manufacture a magnetic memory device, the method including forming a conductive pattern on a substrate, forming a lower magnetic layer, a tunnel barrier layer and an upper magnetic layer on the conductive pattern, forming a hard mask pattern on the upper magnetic layer. The method may include etching the upper magnetic layer, the tunnel barrier layer, and the lower magnetic layer by an etching process using a mixed etching gas including ammonia ($NH_3$) gas, together with oxygen gas, and a fluorine-containing gas to form a Magnetic Tunnel Junction (MTJ). The oxygen gas may suppress the removal of the mask pattern during the etching process.

According to example embodiments, a method of manufacturing a phase change memory device includes forming an insulation layer on a substrate including a conductive region, forming a conductive pattern electrically connected to the conductive region through the insulation layer, forming a phase change layer on the conductive pattern and the insulation layer and forming a mask pattern on the phase change layer. The method includes etching the phase change layer using a mixed etching gas including at least ammonia gas and oxygen gas to form a phase change layer pattern. An upper electrode contacting the phase change pattern may be formed.

BRIEF DESCRIPTION OF THE DRAWINGS

The foregoing and other features and advantages of the inventive concepts will be apparent from the more particular description of non-limiting example embodiments, as illustrated in the accompanying drawings in which like reference characters refer to the same parts throughout the different views. The drawings are not necessarily to scale, emphasis instead being placed upon illustrating the principles of the example embodiments. In the drawings.

Example embodiments will be more clearly understood from the following detailed description of non-limiting example embodiments, as illustrated in the accompanying drawings, in which like reference characters refer to the same parts throughout the different views. The drawings are not necessarily to scale, emphasis instead being placed upon illustrating the concepts of example embodiments. In the drawings.

DETAILED DESCRIPTION OF EXAMPLE EMBODIMENTS

Figure 1:
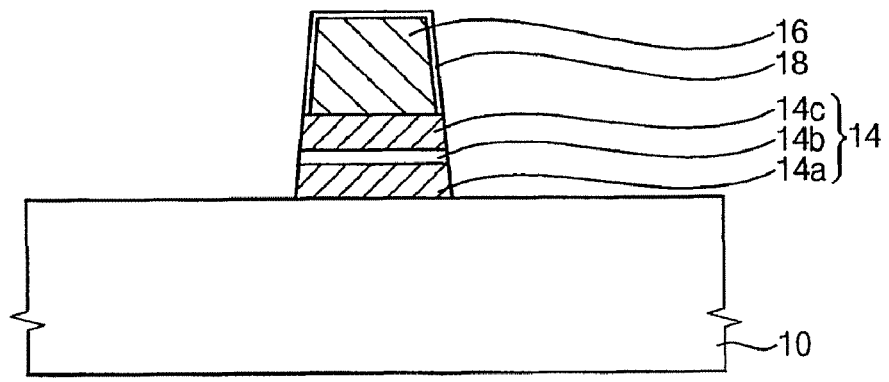
FIG. 1 is a cross-sectional view illustrating a magnetic pattern in accordance with example embodiments.

Various example embodiments will be described more fully hereinafter with reference to the accompanying drawings, in which some example embodiments are shown. Example embodiments of the inventive concepts may, however, be embodied in many different forms and should not be construed as limited to the example embodiments set forth herein. Rather, these example embodiments are provided so that this description will be thorough and complete, and will fully convey the scope of example embodiments of the inventive concepts to those skilled in the art. In the drawings, the sizes and relative sizes of layers and regions may be exaggerated for clarity. Like reference numerals in the drawings denote like elements, and thus their description will be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, however do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments of the inventive concepts.

Unless otherwise defined, all terms (including technical and scientific terms) used herein have the same meaning as commonly understood by one of ordinary skill in the art to which the example embodiments of the inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a magnetic pattern in accordance with example embodiments.

Referring to FIG. 1, a magnetic pattern 14 may be disposed on a substrate 10. The magnetic pattern 14 may include at least one magnetic material. The magnetic pattern 14 may have a line width of about 30 nm to about 100 nm, but example embodiments are not limited thereto. The magnetic pattern 14 may have a multi-stacked structure including a lower magnetic pattern 14a, a tunnel barrier layer pattern 14b and an upper magnetic pattern 14c.

Specifically, the lower magnetic pattern 14a may include at least one of cobalt (Co), iron (Fe), terbium (Tb), ruthenium (Ru), palladium (Pd), platinum (Pt), manganese (Mn) and iridium (Ir), etc., and combinations thereof. The lower magnetic layer 12a may have a single-layered structure or a multi-layered structure.

The tunnel barrier layer pattern 14b may include an insulating material. For example, the tunnel barrier layer pattern 14b may include a metal oxide such as magnesium oxide (MgO), aluminum oxide (AlOx), etc., but example embodiments are not limited thereto.

The upper magnetic pattern 14c may include an alloy of at least two of Co, Fe, Tb, Ru, Pd, Pt, Mn and Ni, and combinations thereof. For example, the upper magnetic pattern 14c may include CoFeB, CoFe or NiFe, but example embodiments are not limited thereto.

In example embodiments, the lower magnetic pattern 14a may serve as a fixed layer pattern having a fixed magnetization direction and the upper magnetic pattern 14c may serve as a free layer pattern having a switchable magnetization direction. On the contrary, the lower magnetic pattern 14a may serve as a free layer pattern and the upper magnetic pattern 14c may serve as a fixed layer pattern by replacing the materials.

A hard mask 16 including a metal may be disposed on the magnetic pattern 14. The hard mask 16 may include, e.g., titanium, titanium nitride, tantalum, tantalum nitride, tungsten, tungsten nitride, etc. These may be used alone or in a combination thereof.

A metal oxide layer 18 may be formed on the hard mask 16. The metal oxide layer 18 may include a metal substantially the same as that of the hard mask 16. For example, a surface of the hard mask 16 may be oxidized to form the metal oxide layer 18. The metal oxide layer 18 may have a thickness less than about 100 Å.

Figure 2:
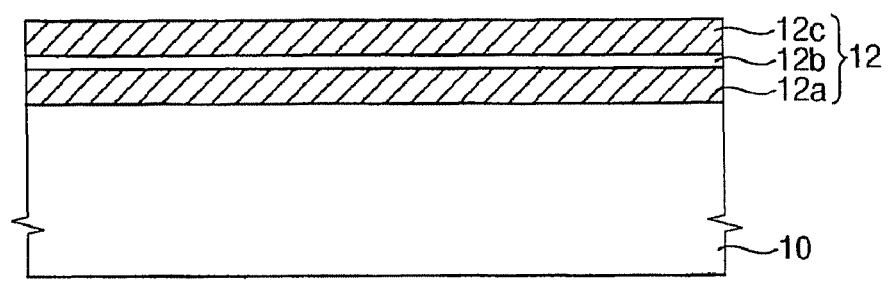
FIGS. 2 to 4 are cross-sectional views illustrating a method of forming the magnetic pattern illustrated in FIG. 1.
Figure 3:
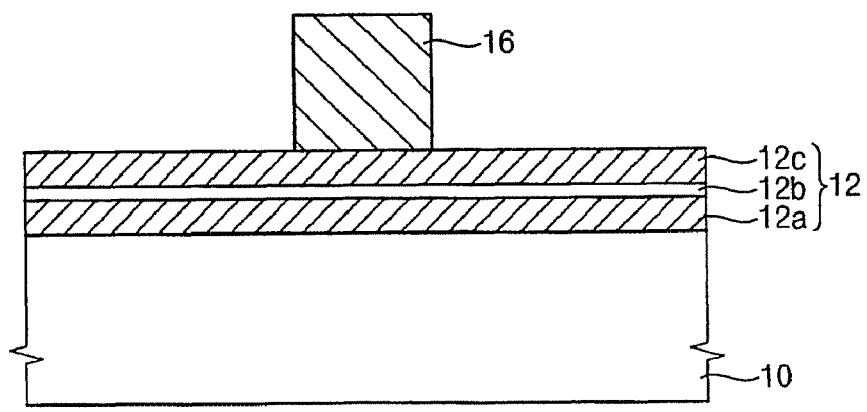
Figure 4:
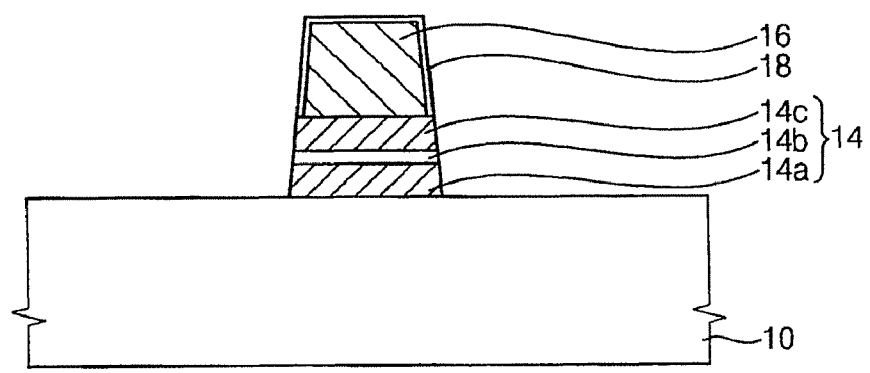

FIGS. 2 to 4 are cross-sectional views illustrating a method of forming the magnetic pattern illustrated in FIG. 1.

Referring to FIG. 2, a magnetic layer structure 12 may be formed on a substrate 10. In example embodiments, the magnetic layer structure 12 may be formed using an alloy including at least two of Co, Fe, Tb, Ru, Pd, Pt, Mn, Ir, and combinations thereof.

In the example embodiments, the magnetic layer structure 12 may be formed to have a stacked structure for forming a Magnetic Tunnel Junction (MTJ) structure. For example, the magnetic layer structure 12 may be formed by sequentially stacking a lower magnetic layer 12a, a tunnel barrier layer 12b and an upper magnetic layer 12c on the substrate 10.

The lower magnetic layer 12a may be formed by depositing at least one of Co, Fe, Tb, Ru, Pd, Pt, Mn, Ir, and combinations thereof. The lower magnetic layer 12a may have a magnetization fixed in one direction. The lower magnetic layer 12a may have a single-layered structure or a multi-layered structure.

The tunnel barrier layer 12b may be formed using a metal oxide having an insulating property, e.g., magnesium oxide (MgO), an aluminum oxide (AlO$_x$), etc., but example embodiments are not limited thereto.

The upper magnetic layer 12c may be formed by depositing an alloy including at least two of Co, Fe, Tb, Ru, Pd, Pt, Mn and Ni. For example, the upper magnetic layer 12c may be formed using CoFeB, CoFe or NiFe. The upper magnetic layer 12c may have a magnetization that may not be fixed in one direction but the direction of the magnetization may be reversed.

In example embodiments, the lower magnetic layer 12a may serve as a fixed layer having a fixed magnetization direction and the upper magnetic layer 12c may serve as a free layer having a switchable magnetization direction. Alternatively, the lower magnetic layer 12a may serve as a free layer and the upper magnetic layer 12c may serve as a fixed layer.

Examples of the material used for the fixed layer may include iron manganese (FeMn), iridium manganese (IrMn), platinum manganese (PtMn), manganese oxide (MnO), manganese sulfide (MnS), manganese telluride (MnTe), manganese difluoride (MnF$_2$), iron difluoride (FeF$_2$), iron dichloride (FeCl$_2$), iron oxide (FeO), cobalt dichloride (CoCl$_2$), cobalt oxide (CoO), nickel dichloride (NiCl$_2$), nickel oxide (NiO), chromium (Cr), etc., but example embodiments are not limited thereto. These may be used alone or in a mixture thereof.

Referring to FIG. 3, a hard mask layer may be formed on the magnetic layer structure 12. The hard mask layer may be formed using a metal or a metal nitride, e.g., titanium, titanium nitride, tantalum, tantalum nitride, tungsten, tungsten nitride, etc. These may be used alone or in a combination thereof. The hard mask layer may be patterned to form a hard mask 16. The hard mask 16 may be formed to have a line width of about 30 nm to about 100 nm.

Referring to FIG. 4, the magnetic layer structure 12 may be partially removed using the hard mask 16 as an etching mask by a plasma reactive etching process. In the etching process, a mixed gas including a fluorine containing gas and ammonia gas may serve as an etching gas and oxygen gas may serve as a reactive gas. The oxygen gas may be used for suppressing a removal of the hard mask 16. Accordingly, a magnetic pattern 14 including a lower magnetic pattern 14a, a tunnel barrier layer pattern 14b and an upper magnetic pattern 14c which are sequentially stacked on the substrate 10 may be formed.

Figure 5:
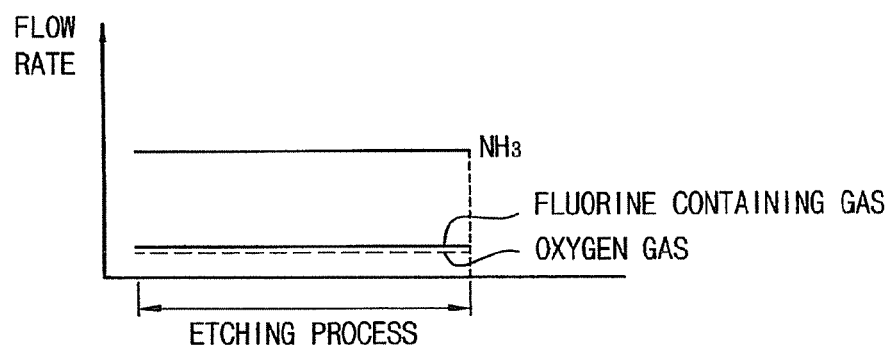
FIG. 5 is a timing diagram illustrating gas flows in an etching process according to the example embodiments.

FIG. 5 is a timing diagram illustrating gas inflow in an etching process according to the example embodiments.

Examples of the fluorine containing gas may include sulfur hexafluoride (SF$_6$), nitrogen trifluoride (NF$_3$), silicon tetrafluoride (SiF$_4$), carbon tetrafluoride (CF$_4$), etc., but example embodiments are not limited thereto. These may be used alone or in a mixture thereof. The fluorine containing gas may be used for patterning the magnetic layer structure 12, and further for preventing a polymer from being attached on a sidewall of the magnetic pattern 14.

The ammonia gas may be reacted with the metal included in the magnetic layer structure 12 to generate a metal ammonium. The metal ammonium may be volatilized so that the magnetic layer structure 12 may be etched. That is, the ammonia gas may accelerate the etching of the magnetic layer structure 12.

The fluorine containing gas may be reacted with the metal included in the magnetic layer structure 12 to generate a metal fluoride. The metal fluoride may be volatilized so that the magnetic layer structure 12 may be etched. For example, SF$_6$ may be used for etching a specific metal such as Pt. Sulfur atoms of SF$_6$ may be combined with nitrogen included in the ammonia gas and may be volatilized, thereby removing the polymer generated by nitrogen. Additionally, fluoride (F) generated from SF$_6$ may remove conductive polymers attached to the sidewall of the magnetic pattern 14 after etching the magnetic layer structure 12.

However, the hard mask 16 may also be etched by the fluorine containing gas together with the magnetic layer structure 12. Thus, as an amount of the fluorine containing gas increases, the removal rate of the hard mask 16 may increase during the etching process. Accordingly, the magnetic layer structure 12 below the hard mask may not be patterned into a desirable shape if too much hard mask is removed. In a specific case of forming a magnetic pattern having a small line width in a range of about 30 nm to about 100 nm, a node separation failure between the neighboring magnetic patterns 14 may occur because the hard mask 16 may also be removed even though a small amount of the fluorine containing gas may be used. Thus, the magnetic pattern 14 having a line width in a range of about 30 nm to about 100 nm may not be easily formed by general methods.

Therefore, as shown in FIG. 5, the ammonia gas may serve as a main etching gas for etching the magnetic layer structure 12. In example embodiments, the ammonia gas may be provided at a flow rate substantially the same as, or more than, that of SF$_6$. For example, a flow rate ratio between SF$_6$ and the ammonia gas may be about 1:1 to 1:50.

When the etching process is performed using only the ammonia gas, the polymer may be produced excessively on the sidewall of the magnetic pattern 14. Therefore, SF$_6$ may be also used together with ammonia gas in order to remove the polymer on the sidewall of the magnetic pattern 14.

Oxygen gas may be further provided for preventing the removal of the hard mask 16 during the etching process using the fluorine containing gas and the ammonia gas. The oxygen gas may be reacted with a surface of the hard mask 16 to form a metal oxide layer 18 thereon. The metal oxide layer 18 may have a lower etching rate than that of the hard mask 16 with respect to the fluorine containing gas. Thus, the removal rate of the hard mask 16 by the fluorine containing gas may be less when oxygen is provided in the etching gas mixture.

However, when an excessive amount of the oxygen gas is provided, the surface of the magnetic pattern 14 may also be oxidized together with the hard mask 16. Therefore, a flow rate of the oxygen gas may be adjusted to oxidize the surface of the magnetic pattern 14 while suppressing an oxidation of the magnetic pattern 14.

When the flow rate of the oxygen gas is more than about 10% of that of the ammonia gas, the magnetic pattern 14 may also be oxidized by the oxygen gas. Further, in this case, the oxygen gas may hinder the etching of the magnetic layer structure 12. Therefore, the oxygen gas may be provided at a flow rate less than about 10% of that of the ammonia gas. For example, the oxygen gas may be provided at a flow rate of about 10 sccm to about 100 sccm. Accordingly, the metal oxide layer 18 may be formed only on the surface of the hard mask 16 that may have a relatively high reactivity with respect to the oxygen gas. The metal oxide layer 18 may be formed to have a thickness equal to or less than about 100 Å.

As shown in FIG. 5, the oxygen gas may be provided continuously during the etching process. Alternatively, the oxygen gas may be provided for a specific period during the etching process.

An inert gas may be further provided during the etching process. The inert gas may include argon (Ar). The inert gas may physically etch the magnetic layer structure 12, control the pressure in an etching chamber or activate plasma, etc. The inert gas may not be used essentially but optionally.

Etching conditions for etching the magnetic layer structure 12 may be set as follows. The etching process may be performed at a temperature of about 10° C. to about 300° C. and under a pressure of about 1 mTorr to about 10 mTorr. Additionally, a micro-wave power of about 700 W to about 1500 W and R.F. bias power of about 200 W to about 700 W may be applied for the etching process.

As described above, in accordance with example embodiments, an etching gas and a gas for suppressing the generation of a conductive polymer may be provided for etching the magnetic layer structure 12.

Additionally, the etching process for the magnetic layer structure 12 may be performed without using a chlorine containing gas to reduce corrosion of the magnetic layer structure 12. The etching process may be performed without using a carbon containing gas to prevent the generation of metal carbonyl. The magnetic layer structure 12 may not be etched by a physical etching process to prevent a magnetic material from being re-deposited on the sidewall of the magnetic pattern 14.

Furthermore, the oxygen gas may be further provided to prevent the removal of the hard mask 16 during the etching process. If the hard mask 16 is removed excessively during the etching process, the magnetic pattern 14 may be formed to have an irregular lateral profile and may be damaged by the attack of the etching gas. Particularly, when the magnetic pattern 14 having a minute line width is formed, a node separation failure between the neighboring magnetic patterns 14 may occur. Additionally, the magnetic patterns 14 may be formed to have an irregular, line with and height, so that a resistance distribution may be increased. However, in example embodiments, the hard mask 16 may be hardly removed during the etching process, and thus the problems as mentioned above may be resolved. Furthermore, the magnetic pattern 14 below the hard mask 16 may have a greater thickness.

Accordingly, the magnetic pattern 14 having a MTJ structure may be formed optimally.

FIGS. 6 to 10 are cross-sectional views illustrating a method of manufacturing a magnetic memory device in accordance with example embodiments.

In example embodiments, a Spin Transfer Torque Magnetic Random Access Memory (STT-MRAM) may be manufactured. The etching process illustrated with reference to FIGS. 3 and 4 may be applied in the example embodiments.

Figure 6:
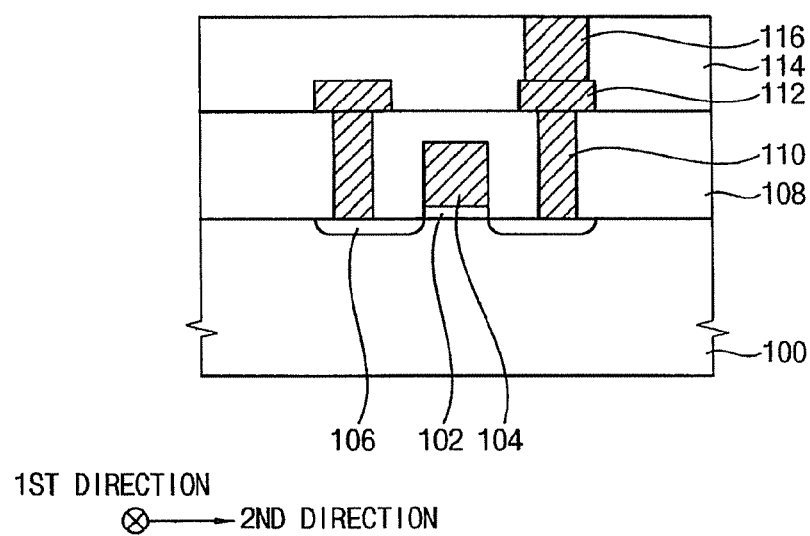
FIGS. 6 to 10 cross-sectional views illustrating a method of manufacturing a magnetic memory device in accordance with example embodiments.

Referring to FIG. 6, an isolation layer pattern (not shown) may be formed on a substrate 100. The isolation layer pattern may divide the substrate 100 into an active region and a field region.

A metal-oxide-semiconductor (MOS) transistor may be fowled on the substrate 100. Particularly, a gate oxide layer and a gate electrode layer may be sequentially formed on the substrate 100. The gate electrode layer and the gate oxide layer may be partially removed to form a gate electrode 104 and a gate oxide layer pattern 102, respectively. Impurities may be implanted into an upper portion of the substrate 100 adjacent to the gate electrode 104 to form an impurity region 106. The gate electrode 104 may be formed to have a linear shape extending in a first direction and serve as a word line. Gate spacers (not shown) may be also formed on sidewalls of the gate electrode 104.

A first insulating interlayer 108 may be formed on the substrate 100 to cover the MOS transistor. A first contact plug 110 may be formed through the first insulating interlayer 108 to be electrically connected to the impurity region 106. A conductive pattern 112 may be formed on the first insulating interlayer 108 to be electrically connected to the first contact plug 110.

A second insulating interlayer 114 may be formed on the first insulating interlayer 108 to cover the conductive pattern 112. The second insulating interlayer 114 may be partially removed to form an opening (not shown) exposing a top surface of the conductive pattern 112. A conductive layer may be foamed on the conductive pattern 112 and the second insulating interlayer 114 to fill the opening. An upper portion of the conductive layer may be polished until a top surface of the second insulating interlayer 114 is exposed to form a second contact plug 116.

Figure 7:
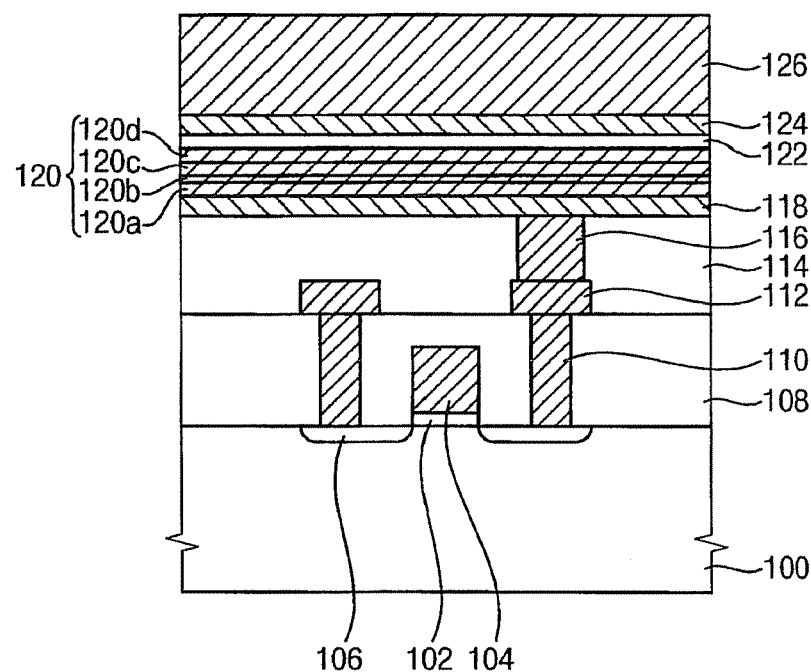

Referring to FIG. 7, a first barrier layer 118, a fixed layer structure 120, a second barrier layer 122 and a free layer 124 may be stacked sequentially on the second insulating interlayer 114 and the second contact plug 116.

The first barrier layer 118 may be formed to prevent an excessive growth of a metal included in the fixed layer structure 120. The first barrier layer 118 may be formed using a metal, for example an amorphous metal, or a metal nitride. For example, the first barrier layer 118 may be formed using tantalum, tantalum nitride, titanium, titanium nitride, etc., but example embodiments are not limited thereto. These may be used alone or in a mixture thereof.

The fixed layer structure 120 may be formed to have a multi-layered structure including, for example, a fixed layer 120a, a lower ferromagnetic layer 120b, a diamagnetic coupling spacer layer 120c and an upper ferromagnetic layer 120d.

The fixed layer 120a may be formed using a material fixing the magnetization of the lower ferromagnetic layer 120b in one direction. Examples of the material used for the fixed layer 120a may include iron manganese (FeMn), iridium manganese (IrMn), platinum manganese (PtMn), manganese oxide (MnO), manganese sulfide (MnS), manganese telluride (MnTe), manganese difluoride ($MnF_2$), iron difluoride ($FeF_2$), iron dichloride ($FeCl_2$), iron oxide (FeO), cobalt dichloride ($CoCl_2$), cobalt oxide (CoO), nickel dichloride ($NiCl_2$), nickel oxide (NiO), chromium (Cr), etc., but example embodiments are not limited thereto. These may be used alone or in a mixture thereof. The lower and upper ferromagnetic layers 120b and 120d may be formed using at least one of Fe, Ni or Co. In example embodiments, the lower and upper ferromagnetic layers 120b and 120d may be formed using CoFe, NiFe or CoFeB. The diamagnetic coupling spacer layer 120c may be formed using Ru, Ir, rhodium (Rh), etc.

The second barrier layer 122 may serve as a tunnel barrier layer. The second barrier layer 122 may be formed using aluminum oxide, magnesium oxide, etc., but example embodiments are not limited thereto. When the second barrier layer 122 is formed using magnesium oxide, the second barrier layer 122 may have a good magnetoresistance (MR) ratio, and the second barrier layer 122 may also be formed using aluminum oxide.

A free layer 124 may be formed using a ferromagnetic material including Fe, Ni, Co, etc. These may be used alone or in a mixture thereof. In example embodiments, the free layer 124 may be formed using CoFe, NiFe or CoFeB, but example embodiments are not limited thereto.

A hard mask layer 126 may be formed on the free layer 124. The hard mask layer 126 may be formed using a metal or a metal nitride. For example, the mask layer 126 may be formed using titanium, titanium nitride, tantalum, tantalum nitride, tungsten, tungsten nitride, etc. These may be used alone or in a combination thereof.

Figure 8:
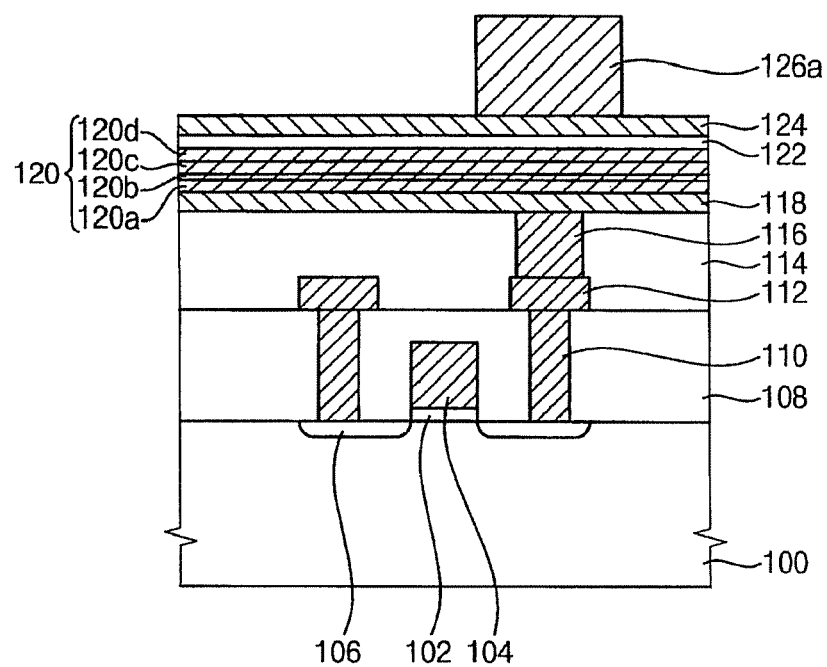

Referring to FIG. 8, the hard mask layer 126 may be anisotropically etched to form a hard mask 126a overlapping the second contact plug 116. The hard mask 126a may serve as an etching mask in an etching process. The hard mask 126a may be formed to have a line width of about 30 nm to about 100 nm.

Figure 9:
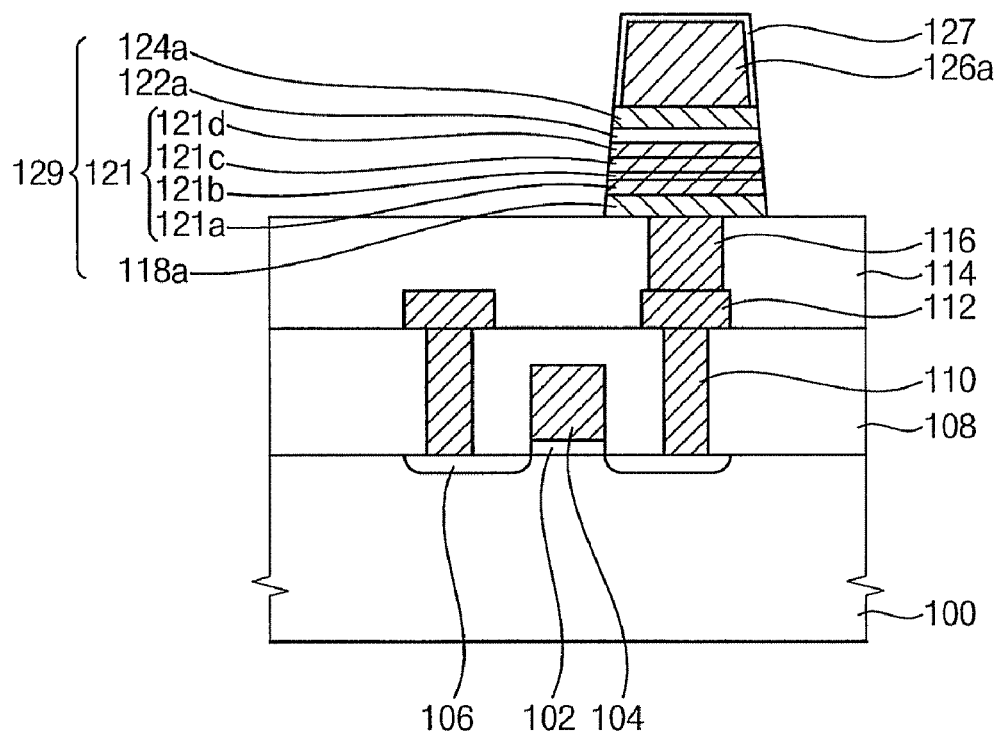

Referring to FIG. 9, the free layer 124, the second barrier layer 122, the fixed layer structure 120 and the first barrier layer 118 may be partially removed using the hard mask 126a as the etching mask by a reactive plasma etching process.

In the etching process, an etching gas including a fluorine containing gas and ammonia gas and oxygen gas may be provided. The oxygen gas may be used for suppressing the removal of the hard mask 126a. The etching process may be substantially the same as that illustrated with reference to FIGS. 3 and 4. The oxygen gas may be reacted with a surface of the hard mask 126a to form a metal oxide layer 127 thereon.

By performing the etching process, a MTJ structure 129 may be formed. The MTJ structure 129 may include a first barrier layer pattern 118a, a fixed layer pattern structure 121, a second barrier layer pattern 122a and a free layer pattern 124a sequentially stacked on the second insulating interlayer 114 and the second contact plug 116. As mentioned above, the second barrier layer pattern 122a may serve as a tunnel barrier layer pattern.

In example embodiments, the hard mask 126a may be hardly removed during the etching process so that the MTJ structure having a line width of about 30 nm to about 100 nm may be formed without damages thereto or generating a node separation failure.

A capping layer (not shown) for protecting the MTJ structure 129 may be further formed on a surface thereof. The capping layer may be formed to have a thickness of about 50 to about 300 Å. The capping layer may be formed using a metal oxide having an insulating property such as an aluminum oxide.

Figure 10:
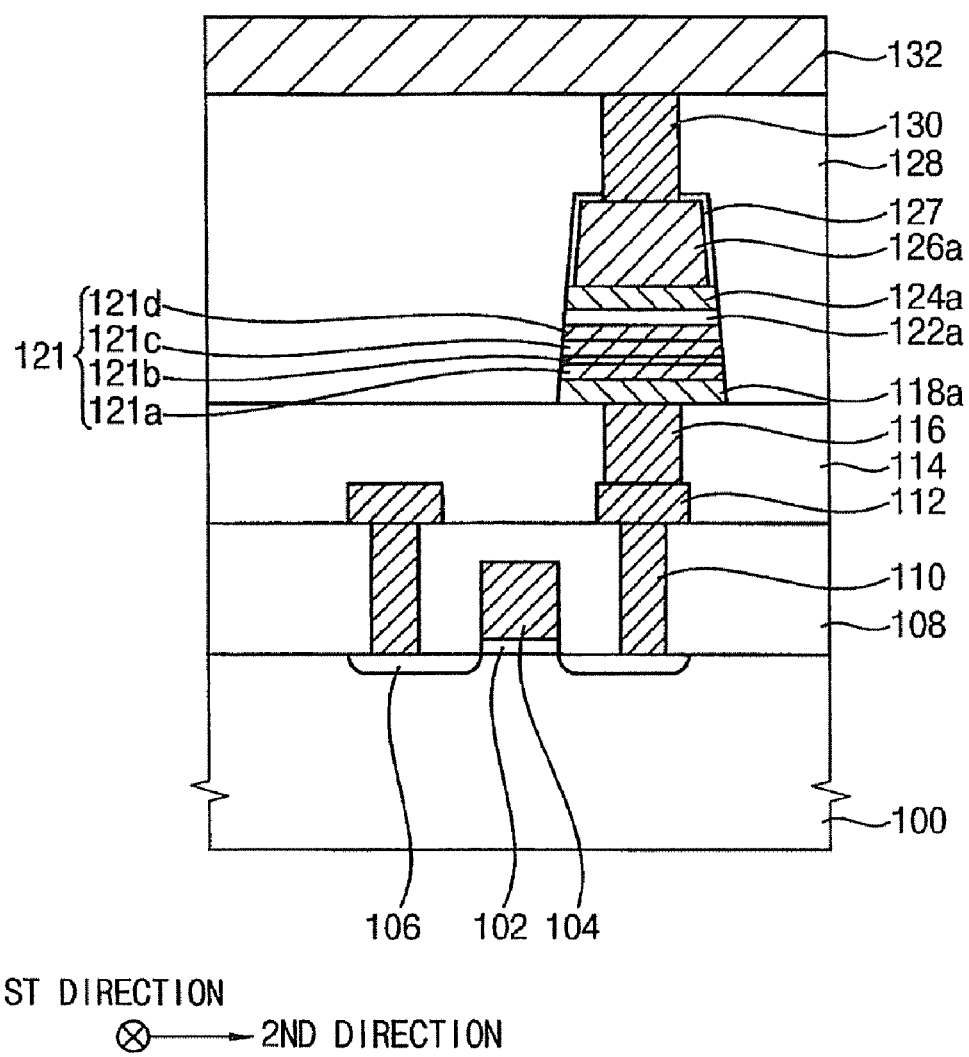

Referring to FIG. 10, a third insulating interlayer 128 may be formed on the second insulating interlayer 114 to cover the MTJ structure 129. The third insulating interlayer 128 and the metal oxide layer 127 may be partially removed to form a contact hole (not shown) exposing a top surface of the hard mask 126a. A conductive layer may be formed on the hard mask 126a and the third insulating interlayer 128 to fill the contact hole, and an upper portion of the conductive layer may be polished until a top surface of the third insulating interlayer 128 is exposed to form a third contact plug 130.

A conductive layer may be formed on the third insulating interlayer 128 to be electrically connected to the third contact plug 130. The conductive layer may be patterned to form a bit line 132. In example embodiments, the bit line 132 may be fowled to extend in a second direction perpendicular to the first direction. Alternatively, the bit line 132 may be formed to directly contact the hard mask 126a without forming the third contact plug 130.

By performing the above processes, the magnetic memory device may be manufactured.

When the magnetization direction of the fixed layer pattern structure 121 is substantially the same as that of the free layer pattern 124a (hereinafter, referred to as a parallel state), the magnetic memory device may have a substantially low resistance. When the magnetization direction of the fixed layer pattern structure 121 is not the same as that of the free layer pattern 124a (hereinafter, referred to as an antiparallel state), the magnetic memory device may have a substantially high resistance. The magnetic memory device may store data using the above the resistance difference. Therefore, the resistance difference between the parallel state and the antiparallel state may be large for an enhanced operation. The above resistance difference may be referred to as a Magnetoresistance Ratio (MR). Particularly, the MR may be at least about 50%, preferably greater than 80%.

When the fixed layer pattern structure 121 and the free layer pattern 124a are short-circuited to each other by a conductive polymer attached to a sidewall of the MTJ structure, an electric current may flow through the conductive polymer, and thus MR may be decreased to be about 0%. Additionally, when a line width or other characteristics variation occurs due to the removal of the hard mask 126a, the MR may be also decreased to be about 0%.

However, in example embodiments, the conductive polymer may not be attached to the sidewall of the MTJ structure 129 and the hard mask 126a may be hardly removed during the etching process so that the magnetic memory device may have a substantially high MR and good operation characteristics. Particularly, the MTJ structure having a line width of about 30 nm to about 100 nm may be formed so that the magnetic memory device may be highly integrated and have a low property distribution.

Figure 11:
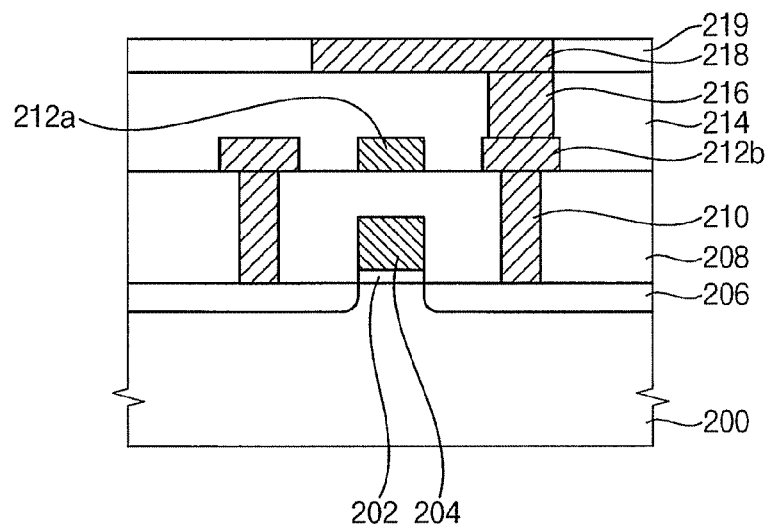
FIGS. 11 to 13 are cross-sectional views illustrating a method of manufacturing a magnetic memory device in accordance with example embodiments.
Figure 12:
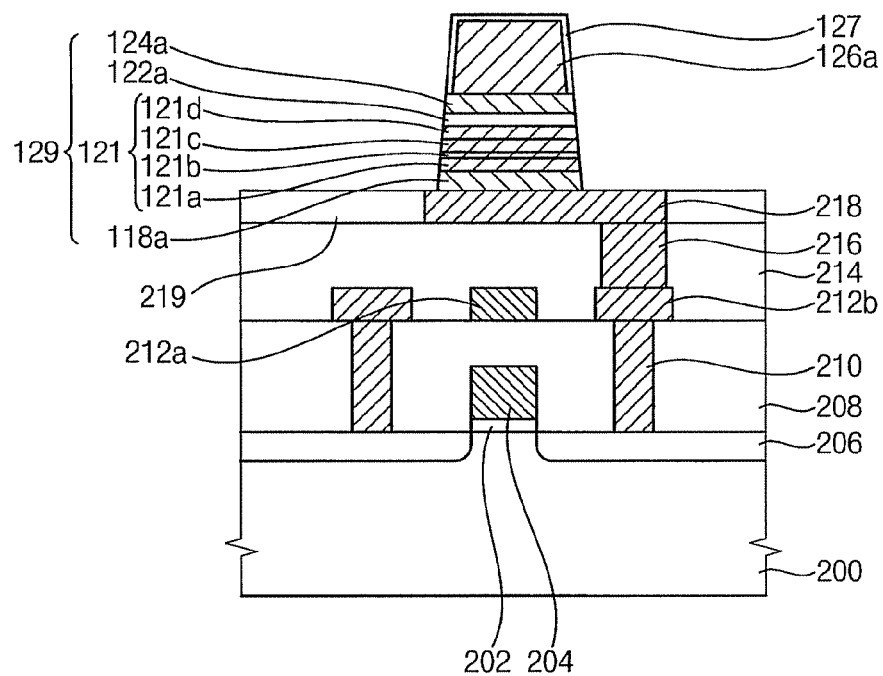
Figure 13:
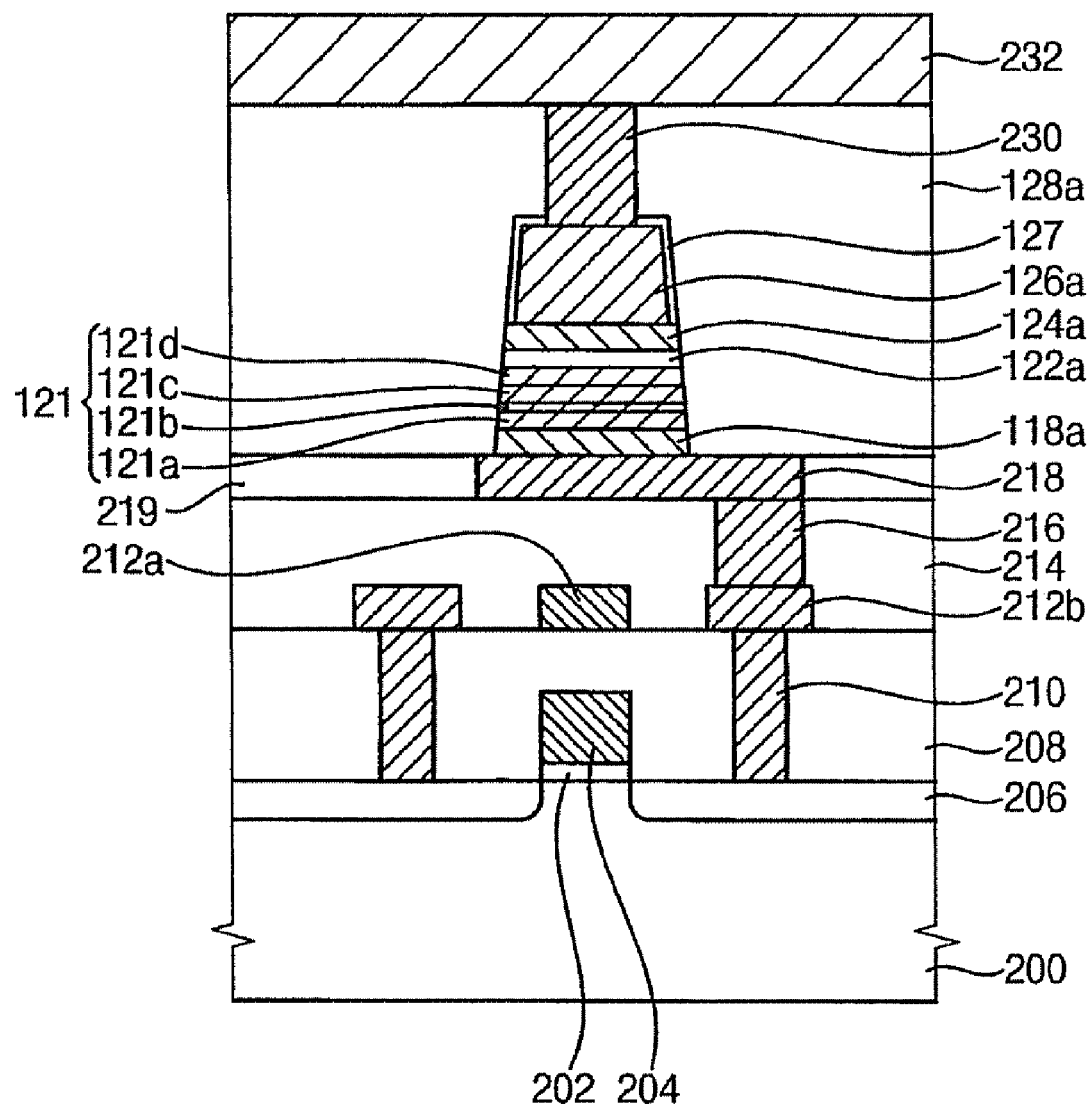

FIGS. 11 to 13 are cross-sectional views illustrating a method of manufacturing a magnetic memory device in accordance with example embodiments.

The magnetic memory device according to the example embodiments may generate a magnetization reversal using an external magnetic field. The etching process illustrated with reference to FIGS. 3 and 4 may be also applied in the example embodiments.

Referring to FIG. 11, an isolation layer pattern (not shown) may be formed on a substrate 200. The isolation layer pattern may divide the substrate 200 into an active region and a field region. A MOS transistor for selecting cells that may include a gate electrode 204, a gate oxide layer pattern 202 and an impurity region 206 may be formed on the substrate 200. A gate spacer (not shown) may be formed on sidewalls of the gate electrode 204.

A first insulating interlayer 208 may be formed on the substrate 200 to cover the MOS transistor. A first contact plug 210 may be formed through the first insulating interlayer 208 to be electrically connected to the impurity region 206.

A digit line 212a may be formed on the first insulating interlayer 208. The digit line 212a may be formed to overlap (or correspond to) the gate electrode 204 for the purpose of high integration. A pad electrode 212b may be formed on the first insulating interlayer 208 to be electrically connected to the first contact plug 210.

A second insulating interlayer 214 may be formed on the first insulating interlayer 208 to cover the digit line 212a and the pad electrode 212b. The second insulating interlayer 214 may be partially removed to form an opening (not shown) exposing a top surface of the pad electrode 212b.

A conductive layer may be formed on the second insulating interlayer 214 and the pad electrode 212b to fill the opening. An upper portion of the conductive layer may be polished until a top surface of the second insulating interlayer 214 is exposed to form a second contact plug 216.

A conductive layer may be fanned on the second contact plug 216 and the second insulating interlayer 214. The conductive layer may be patterned to form a bypass line 218 overlapping the digit line 212a. That is, the bypass line 218 may be formed to extend from a top surface of the second contact plug 216 to a portion of the second insulating interlayer 214 over the digit line 212a.

A third insulating interlayer 219 may be formed on the second insulating interlayer 214 between the bypass lines 218.

Referring to FIG. 12, a first barrier layer, a fixed layer structure, a second barrier layer and a free layer may be sequentially formed on the third insulating interlayer 219 and the bypass line 218.

A hard mask 126a may be formed on the free layer. The free layer, the second barrier layer, the fixed layer structure and the first barrier layer may be partially removed to form a MTJ structure 129 using the hard mask 126a as the etching mask. The MTJ structure 129 may include a first barrier layer pattern 118a, a fixed layer pattern structure 121, a second barrier layer pattern 122a and a free layer pattern 124a sequentially stacked on the bypass line 218. In the etching process, a fluorine containing gas and ammonia gas may be used as an etching gas and oxygen gas may be further provided in order to suppress the removal of the hard mask 126a. The etching process may be substantially the same as, or similar to, that illustrated with reference to FIGS. 7 to 9. A metal oxide layer 127 may be formed on a surface of the hard mask 126a during the etching process.

Referring to FIG. 13, a fourth insulating interlayer 128a may be formed on the third insulating interlayer 219 and the bypass line 218 to cover the MTJ structure 129. The fourth insulating interlayer 128a may be partially removed to form a contact hole (not shown) exposing a top surface of the hard mask 126a. A conductive layer may be formed on the fourth insulating interlayer 128a and the hard mask 126a to fill the contact hole. An upper portion of the conductive layer may be polished until a top surface of the fourth insulating interlayer 128a is exposed to form an upper electrode contact 230.

A conductive layer may be formed on the fourth insulating interlayer 128a and the upper electrode contact 230. The conductive layer may be patterned to form a bit line 232 to be electrically connected to the upper electrode contact 230. Alternatively, the bit line 232 may be formed to directly contact the hard mask 126a without forming the upper electrode contact 230.

Figure 14:
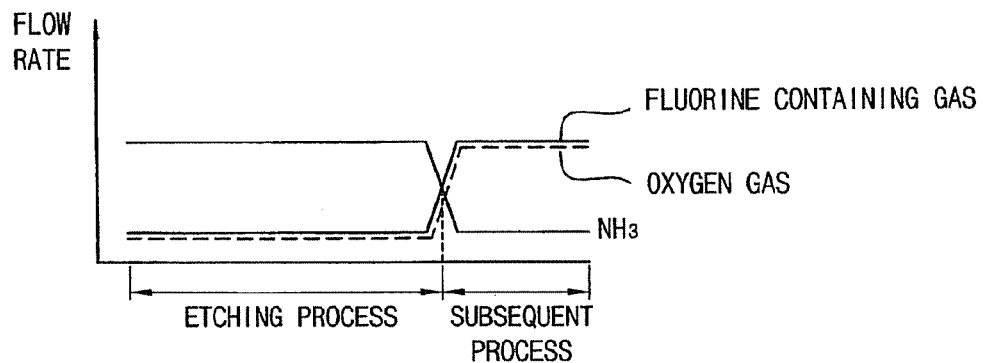
FIG. 14 is a timing diagram illustrating gas flows in an etching process and a subsequent process on a magnetic layer in accordance with example embodiments.

FIG. 14 is a timing diagram illustrating gas inflow in an etching process and a subsequent process on a magnetic layer in accordance with example embodiments.

First, processes illustrated with reference to FIGS. 2 and 3 may be performed to form a magnetic layer structure 12 as shown in FIG. 3. Then, as illustrated in FIG. 4, the magnetic layer structure 12 may be etched to form a magnetic pattern 14.

After the etching process, a subsequent process may be performed to clean a surface of the magnetic pattern 14, remove a residual polymer thereon and suppress a removal of the hard mask 16. The etching process and the subsequent process may be performed in situ in an etching chamber.

Hereinafter, the subsequent process will be explained in detail.

Referring to FIG. 14, a fluorine containing gas, ammonia gas, and oxygen gas may be used in the subsequent process. The fluorine containing gas may be substantially the same as that of the etching process. However, a flow rate of the fluorine gas may be different from that in the etching process. Alternatively, the fluorine containing gas may be different from that of the etching process. The fluorine containing gas may include $SF_6$, $NF_3$, $SiF_4$, $CF_4$, etc., but example embodiments are not limited thereto.

In the subsequent process, the flow rate of the fluorine containing gas may be increased and a flow rate of the ammonia gas that may generate polymers may be decreased in order to clean the surface of the magnetic pattern 14 and remove the residual polymers. Thus, the fluorine containing gas may be provided at a flow rate substantially the same as, or greater than, that of the ammonia gas. In example embodiments, a flow rate ratio between the ammonia gas and the fluorine containing gas may be about 1:1 to about 1:50.

The subsequent process may be performed in a time shorter than that of the etching process in order to prevent the hard mask 16 from being etched excessively by the fluorine containing gas.

A flow rate of the oxygen gas in the subsequent process may be greater than that in the etching process for suppressing an excessive removal of the hard mask 16. Even though the flow rate of the oxygen gas is increased, the surface of the magnetic pattern 14 may not be oxidized because the subsequent process may be performed in a very short time. Alternatively, the flow rate of the oxygen gas in the subsequent process may be substantially the same as that in the etching process.

If a flow rate ratio of the oxygen gas with respect to the fluorine containing gas is less than about 0.1 in the subsequent process, the hard mask 16 may be partially removed or etched. If the flow rate ratio of the oxygen gas with respect to the fluorine containing gas is greater than about 2, the surface of the magnetic pattern 14 may be also oxidized and the residual polymers may not be easily removed by the fluorine containing gas. Therefore, the flow rate ratio of the oxygen gas with respect to the fluorine containing gas may be in a range of about 0.1 to about 2.

The subsequent process may be performed at a temperature of about 10° C. to about 300° C. and under a pressure of abut 1 mTorr to about 10 mTorr. The process conditions, for example, a process temperature or pressure, in the subsequent process may be substantially the same as, or different from those in the etching process.

A micro-wave power of about 700 W to about 1500 W and a R.F. bias power of about 200 W to about 700 W may be applied in the subsequent process. The micro-wave power and the R.F. bias power may be substantially the same as, or different from, those in the etching process.

According to the above-described method, a conductive polymer may not remain on the sidewall of the magnetic pattern 14 having a MTJ structure. Further, the magnetic pattern 14 may be formed without the removal of the hard mask 16.

A magnetic memory device may be manufactured using the method of forming the magnetic pattern 14.

Particularly, after performing processes substantially the same as those illustrated with reference to FIGS. 6 to 8, the etching and subsequent processes illustrated with reference to FIG. 14 may be performed to form a MTJ structure. Then, a process illustrated with reference to FIG. 10 may be performed to faun the STT-MRAM device as shown in FIG. 10.

Alternatively, after performing a process substantially the same as that illustrated with reference to FIG. 11, the etching and subsequent processes illustrated with reference to FIG. 14 may be performed to form the MTJ structure. Then, the process illustrated with reference to FIG. 13 may be performed to form the magnetic memory device in FIG. 13.

Figure 15:
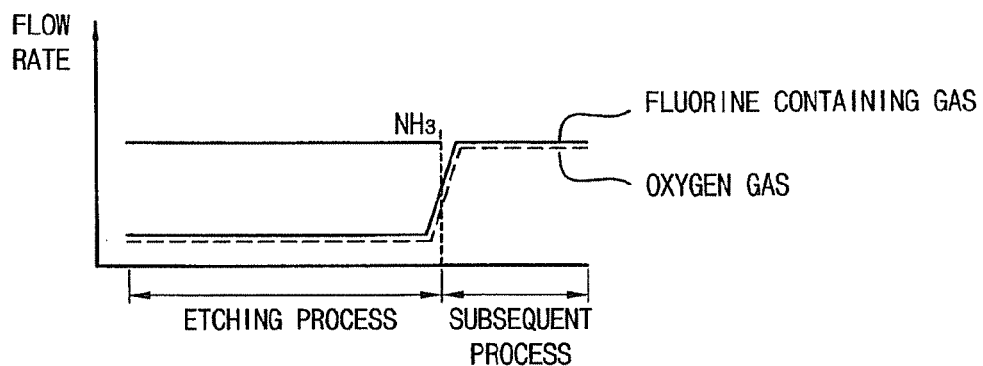
FIG. 15 is a timing diagram illustrating gas inflow in an etching process and a subsequent process on a magnetic layer in accordance with example embodiments.

FIG. 15 is a timing diagram illustrating gas inflow in an etching process and a subsequent process on a magnetic layer in accordance with example embodiments;

Referring to FIG. 15, in a subsequent process, only a fluorine containing gas and oxygen gas may be provided and ammonia gas may not be used. The fluorine containing gas may be substantially the same as, or different from, that used in the etching process. The fluorine containing gas may include $SF_6$, $NF_3$, $SiF_4$, $CF_4$, etc.

In the subsequent process, the fluorine containing gas may be provided in order to clean a surface of the magnetic pattern 14 and remove residual polymers. The ammonia gas that may generate the polymers may not be provided.

The fluorine containing gas in the subsequent process may be provided at a flow rate substantially the same as, or more than, that of the fluorine containing gas in the etching process.

Further, the subsequent process may be performed in a time shorter than that of the etching process in order to prevent the hard mask 16 from being etched excessively by the fluorine containing gas.

A flow rate of the oxygen gas in the subsequent process may be greater than that in the etching process for suppressing an excessive removal of the hard mask 16. Alternatively, the flow rate of the oxygen gas in the subsequent process may be substantially the same as that in the etching process. A flow rate ratio of the oxygen gas with respect to the fluorine containing gas may be in a range of about 0.1 to about 2.

The subsequent process may be performed at a temperature of about 10° C. to about 300° C. and under a pressure of about 10 mTorr. The process conditions, e.g., a process temperature or pressure, may be substantially the same as, or different from, those of the etching process.

A micro-wave power of about 700 W to about 1500 W and an R.F. bias power of about 200 W to about 700 W may be applied in the subsequent process. The micro-wave power and the R.F. bias power conditions of the subsequent process may be substantially the same as, or different from, those of the etching process.

According to the above-described method, a conductive polymer may not remain on the sidewall of the magnetic pattern 14 having a MTJ structure. Further, the magnetic pattern 14 may be formed without the removal of the hard mask 16 and the metal oxide layer may be formed on the hard mask 16.

A magnetic memory device may be manufactured using the method of forming the magnetic pattern 14.

Particularly, after performing processes substantially the same as those illustrated with reference to FIGS. 6 to 8, the etching and subsequent processes illustrated with reference to FIG. 15 may be performed to form the MTJ structure. Then, a process illustrated with reference to FIG. 10 may be performed to form a STT-MRAM device as shown in FIG. 10.

Alternatively, after performing a process substantially the same as that illustrated with reference to FIG. 11, the etching and subsequent processes illustrated with reference to FIG. 15 may be performed to the MTJ structure. Then, the process illustrated with reference to FIG. 13 may be performed to form a magnetic memory device in FIG. 13.

Figure 16:
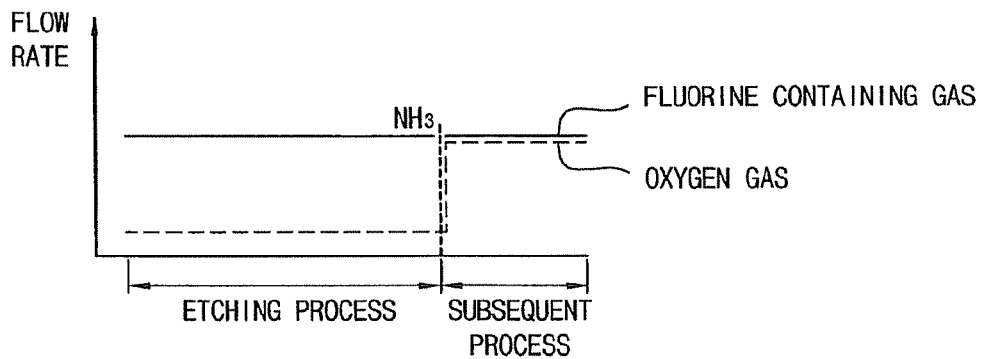
FIG. 16 is a timing diagram illustrating gas inflow in an etching process and a subsequent process on a magnetic layer in accordance with example embodiments.

FIG. 16 is a timing diagram illustrating gas inflow in an etching process and a subsequent process on a magnetic layer in accordance with example embodiments.

Referring to FIG. 16, in the etching process, ammonia gas and oxygen gas may be provided. The oxygen gas may be provided at a flow rate of less than about 10% of that of the ammonia gas. The oxygen gas may be provided at a flow rate of about 10 to about 100 sccm. An inert gas such as argon may be further provided.

The ammonia gas may be reacted with a metal of the magnetic layer 12 to generate a metal ammonium. The metal ammonium may be volatilized so that the magnetic layer 12 may be etched. The magnetic layer may be etched rapidly by the ammonia gas. The oxygen gas may be reacted with a surface of the hard mask 16 to form the metal oxide layer thereon, so that the hard mask 16 may be hardly removed during the etching process.

The etching process may be performed at a temperature of about 10° C. to about 300° C. and under a pressure of about 1 mTorr to about 10 mTorr. A micro-wave power of about 700 W to about 1500 W and an R.F. bias power of about 200 W to about 700 W may be applied in the cleaning process.

By the above etching process, the magnetic pattern 14 may be formed.

After the etching process, a fluorine containing gas may be provided to perform a subsequent process. In the subsequent process, the ammonia gas may not be provided, or an inflow of the ammonia gas may be decreased. By providing the fluorine containing gas, a surface of the magnetic pattern 14 may be cleaned and residual polymers may be removed therefrom.

A flow rate of the oxygen gas in the subsequent process may be greater than that in the etching process for suppressing an excessive removal of the hard mask 16. A flow rate ratio of the oxygen gas with respect to the fluorine containing gas may be in a range of about 0.1 to about 2.

According to the above-described method, a conductive polymer may not remain on the sidewall of the magnetic pattern 14. Further, the magnetic pattern 14 may be formed without the removal of the hard mask 16 to have a uniform pattern profile.

A magnetic memory device may be manufactured using the method of forming the magnetic pattern 14.

Particularly, after performing processes substantially the same as those illustrated with reference to FIGS. 6 to 8, the etching and subsequent processes illustrated with reference to FIG. 16 may be performed to form the MTJ structure. Then, a process illustrated with reference to FIG. 10 may be performed to form a STT-MRAM device as shown in FIG. 10.

Alternatively, after performing a process substantially the same as that illustrated with reference to FIG. 11, the etching and subsequent processes illustrated with reference to FIG. 16 may be performed on the MTJ structure. Then, a process illustrated with reference to FIG. 13 may be performed to form a magnetic memory device in FIG. 13.

Experiment 1 on Magnetoresistance Ratio

EXAMPLE 1

Figure 17:
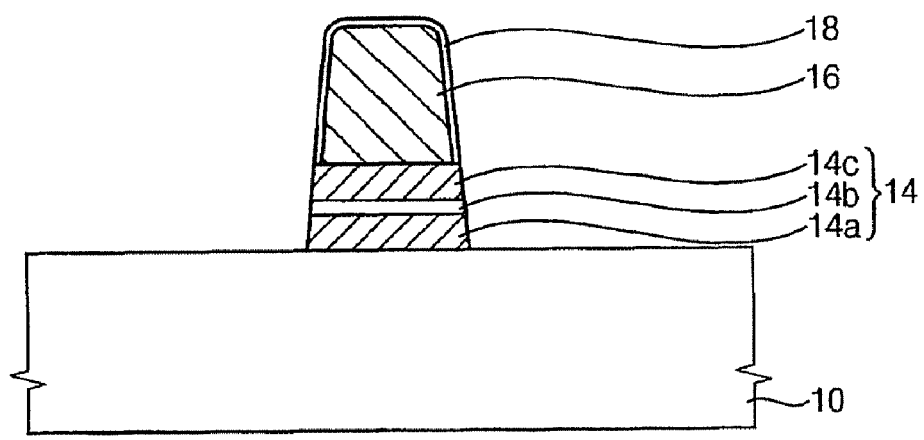
FIG. 17 is a cross-sectional view illustrating a MTJ structure in accordance with Example 1.

FIG. 17 is a cross-sectional view illustrating a MTJ structure in accordance with Example 1.

The MTJ structure was formed as follows.

Referring to FIG. 10, a MTJ material layer was formed on a substrate 10. Specifically, a first barrier layer was formed on the substrate 10 using tantalum (Ta). A fixed layer was formed on the first barrier layer using PtMn. A CoFe layer, a Ru layer and a CoFe layer were stacked sequentially on the fixed layer. A second barrier layer (i.e., a tunnel barrier layer) was formed on the CoFe layer using MgO. A free layer was formed on the tunnel barrier layer using CoFeB.

A hard mask layer including a titanium layer and titanium nitride layer. The hard mask layer was patterned to form a hard mask 16 including a titanium layer pattern and a titanium nitride layer pattern. The hard mask 16 was formed to have a line width of about 50 nm.

The MTJ material layer was etched using the hard mask as an etching mask by an etching process illustrated with reference to FIG. 4 to form a MTJ structure 14 including a first barrier layer pattern (not shown), a fixed layer pattern structure 14a, a tunnel barrier layer pattern 14b and a free layer pattern 14c sequentially stacked on the substrate 10. The MTJ structure 14 was formed to have a line width of about 50 nm. $SF_6$ gas and $NH_3$ gas and oxygen gas served as an etching gas in the etching process. Flow rates of the $SF_6$ gas, the $NH_3$ gas and the oxygen gas were 50 sccm, 2000 sccm and 30 sccm, respectively. By performing the etching process, a metal oxide layer 18 was formed on a surface of the hard mask 16.

By performing the process as described above, a plurality of MTJ structures having various resistances of the tunnel barrier pattern 14b was formed according to Example 1.

COMPARATIVE EXAMPLE 1

Figure 18:
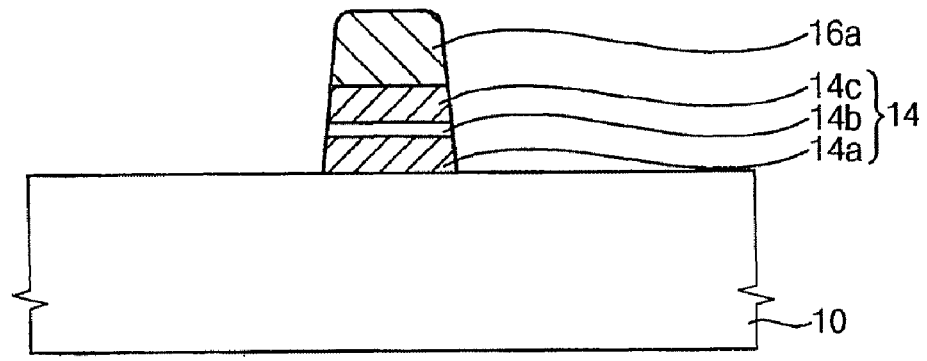
FIG. 18 is a cross-sectional view illustrating a MTJ structure in accordance with Comparative Example 1.

FIG. 18 is a cross-sectional view illustrating a MTJ structure in accordance with Comparative Example 1.

A MTJ material layer and a hard mask layer were formed on a substrate 10. The hard mask layer was patterned to form a hard mask 16a. The MTJ material layer and the hard mask 16a was formed by a method substantially the same as that of the above Example 1.

The MTJ material layer was etched using the hard mask 16a as an etching mask to form a MTJ structure 14 having a line width about 50 nm. $SF_6$ gas and $NH_3$ gas were used as etching gases and oxygen gas was not provided in the etching process. The $SF_6$ gas and the $NH_3$ gas were provided at flow rates of 50 sccm and 2000 sccm, respectively. A metal oxide layer was not formed on a surface of the hard mask 16a during or after the etching process.

By performing the method described above, a plurality of MTJ structures having various resistances of the tunnel barrier pattern 14b was formed.

The MR ratios of the MTJ structures in Example 1 and Comparative Example 1 were measured.

Figure 19:
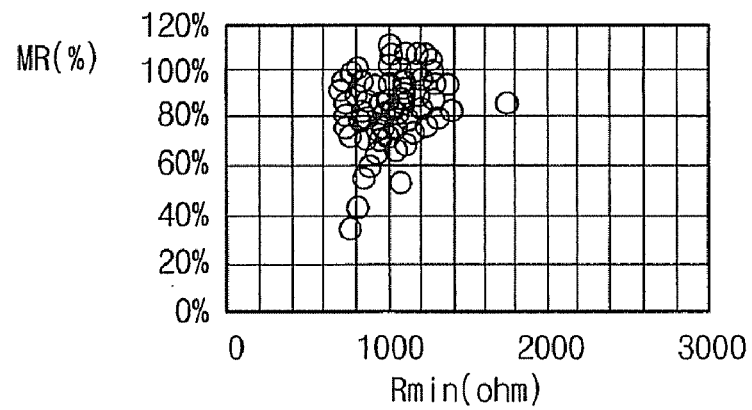
FIG. 19 is a graph showing MR ratios of the MTJ structures according to the Example 1.

FIG. 19 is a graph showing MR ratios of the MTJ structures according to Example 1.

Referring to FIG. 19, most of the MR ratios of the MTJ structures were measured to have a MR ratio greater than about 80%, regardless of the resistance of the tunnel barrier layer pattern 14b included in the MTJ structures. An average of the MR ratios was measured to be about 91.3%. Further, the fixed layer pattern structure 14a and the free layer pattern 14c were not short-circuited to each other, and thus the MR ratios were not measured below about 20%. A standard deviation of the MR ratios in Example 1 was measured to be about 4.4%

Figure 20:
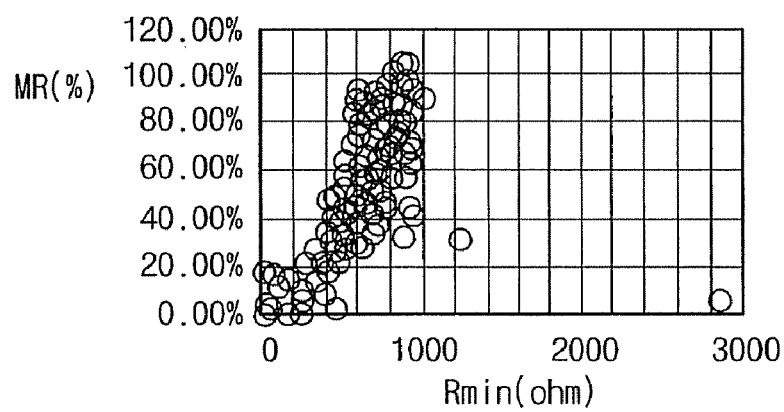
FIG. 20 is a graph showing MR ratios of the MTJ structures of the Comparative Example 1.

FIG. 20 is a graph showing MR ratios of the MTJ structures according to Comparative Example 1.

Referring to FIG. 20, many of the MTJ structures were measured to have a MR ratio lower than about 70%. Additionally, some of MTJ structures had a MR ratio of about 0% due to the electrical short occurring between the fixed layer pattern structure 14a and the free layer pattern 14c. In Comparative Example 1, an average of the MR ratios was measured to be about 51.5% and a standard deviation of the MR ratios was measured to be about 16.5%.

According to FIGS. 19 and 20, the MTJ structures in accordance with example embodiments may have a substantially high MR ratio and low defects. That is, oxygen gas may be further provided in an etching process in order to suppress the removal of a hard mask so that the MTJ structure having a high MR may be formed. Particularly, when the MTJ structure having a line width about 50 nm, the oxygen gas inflow may have a critical effect on the MR ratio of the MTJ structure.

Thus, a memory device having excellent operation characteristics and a high degree of integration may be manufactured according to example embodiments. Moreover, failures or defects of the MTJ structure may be reduced so that a production yield of the memory device may be enhanced.

Although not illustrated, when a MTJ structure having a relatively large line width greater than about 300 nm was formed, the MTJ structure was measured to have a high MR ratio greater than about 80% by using only the $SF_6$ gas and the $NH_3$ gas as an etching gas. Particularly, the MR ratio was measured to be higher than that in the case of using $Cl_2$ and Ar as the etching gas.

However, as illustrated above, when a MTJ structure having a small line width of about 30 nm to about 100 nm was formed, a predetermined MR ratio was obtained by further providing the oxygen gas.

Experiment on a Thickness of a Hard Mask

A hard mask was formed on a MTJ layer and the MTJ layer was etched using the hard mask as an etching mask. After the etching process, a thickness of the remaining hard mask was measured.

Referring to a following Table 1, the MTJ structures in Example 2, Example 3 and Comparative Example 2 were formed by a method substantially the same as that in Example 1 to have a line width of about 50 nm except for a flow rate of oxygen gas.

TABLE 1

|  | NH3 (sccm) | SF6 (sccm) | O2 (sccm) |
| --- | --- | --- | --- |
| Example 1 | 2000 | 50 | 10 |
| Example 2 | 2000 | 50 | 30 |
| Comparative Example 2 | 2000 | 50 | — |

Figure 21:
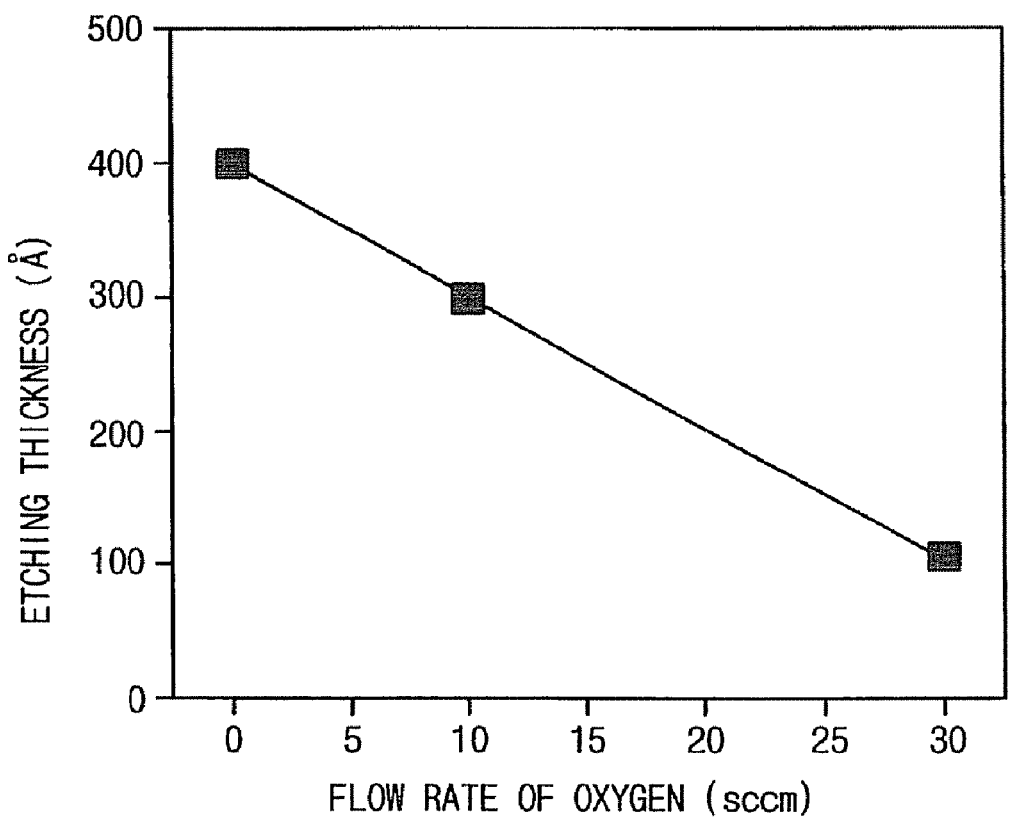
FIG. 21 is a graph showing an etching thickness of a hard mask according to an amount of oxygen inflow.

FIG. 21 is a graph showing an etching thickness of a hard mask according to an amount of oxygen inflow.

Referring to FIG. 21, the etching thickness of the hard mask was decreased as the amount of oxygen inflow was increased. That is, FIG. 21 shows that the hard mask was protected by the oxygen inflow from being removed during an etching process.

Hereinafter, methods of forming a phase change pattern and manufacturing a phase change memory device using the etching process in accordance with example embodiments will be explained.

Figure 22:
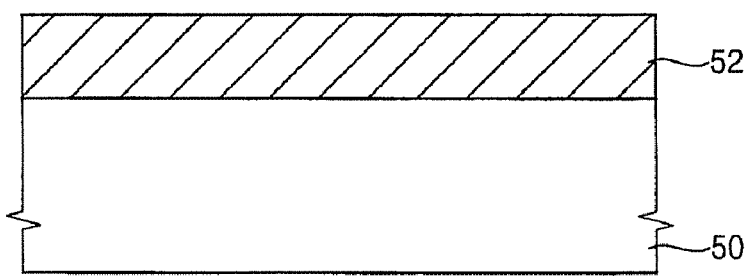
FIGS. 22 to 24 are cross-sectional views illustrating a method of forming a phase change pattern in accordance with example embodiments.
Figure 23:
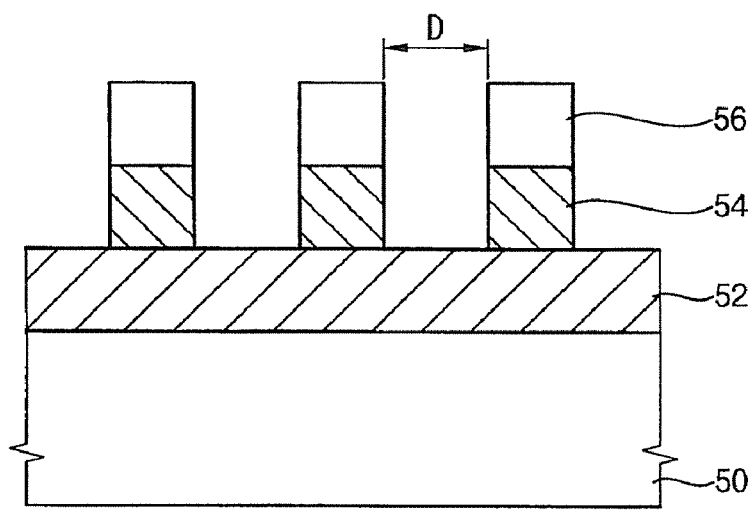
Figure 24:
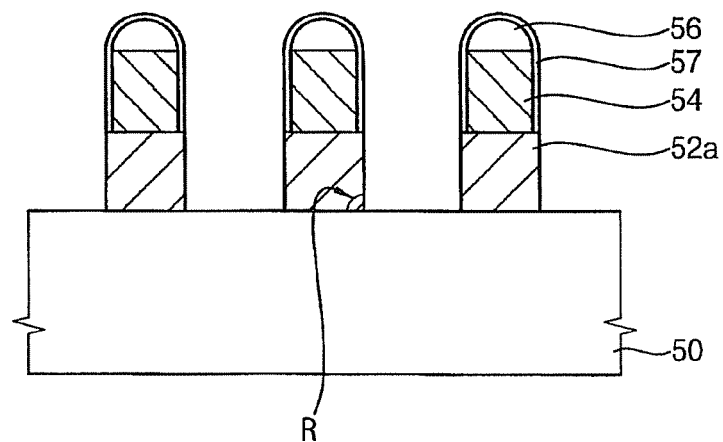

FIGS. 22 to 24 are cross-sectional views illustrating a method of forming a phase change pattern in accordance with example embodiments.

Referring to FIG. 22, a phase change layer 52 may be formed on a substrate 50 using a phase change material such as an alloy including at least three elements of germanium (Ge), antimony (Sb), tellurium (Te), indium (In) and bismuth (Bi). For example, the phase change layer 52 may be formed using an alloy including Ge, Sb and Te ($Ge_2Sb_2Te_5$, GST), an alloy including In, Sb and Te (IST) or an alloy including Ge, Bi and Te (GBT), etc. In example embodiments, the phase change layer 52 may be formed using GST. GST is widely used for a commercialized phase change optical storage device (e.g., CD-RW, DVD, etc.), and is recognized as a very stable material.

Referring to FIG. 23, a first mask layer (not shown) may be foamed on the phase change layer 52. The first mask layer may be formed using a metal or a metal nitride, e.g., titanium, titanium nitride, tantalum, tantalum nitride, tungsten, tungsten nitride, etc. These may be used alone, or in a mixture thereof.

A second mask layer (not shown) may be formed on the first mask layer. The second mask layer may serve as an etching mask for patterning the first mask layer. The second mask layer may be formed using silicon nitride.

The second mask layer may be patterned to form a second mask 56. The first mask layer may be etched using the second mask 56 as an etching mask. By performing the process, a first mask 54 serving as an etching mask for etching the phase change layer 52 may be formed. A gap (D) between the first masks 54 may be less than about 1000 Å. The first mask 54 may be formed to have a line width of about 30 nm to about 100 nm.

Referring to FIG. 24, the phase change layer may be partially removed using the first and second masks 54 and 56 as an etching mask by a plasma reactive etching process in which ammonia gas may be used as an etching gas together with oxygen gas. The oxygen gas may be used for suppressing a removal of the first and second masks 54 and 56 by the etching gas. Accordingly, a phase change patterns 52a may be formed on the substrate 50 to have a line width of about 30 nm to about 100 nm.

The ammonia gas may be reacted with the phase change material included in the phase change layer 52, and reactants may be volatilized to etch the phase change layer 52.

When the ammonia gas serves as an etching gas, the Ge, Sb and Te elements included in the phase change layer 52 may be etched faster at about the same rate. Therefore, a composition ratio of the phase change layer 52 may be maintained substantially uniform during the etching process. Particularly, a component ratio of every element included in the phase change pattern 52a after the etching process may be within about 5% of that before the etching process.

Even though the area of the phase change layer to be etched may be narrow, an etching rate may not be decreased. Accordingly, the phase change pattern 52a may have a good vertical profile and a narrow pitch. Particularly, the acute angle R of sidewalls of the phase change pattern 52a with respect to a top surface of the substrate 50 may be more than about 80°. The gap between the phase change patterns 52a may be less than about 1000 Å. As described above, even though the phase change patterns 52a may be formed to have a narrow gap, there may be no lower portion of the phase change layer 52 that is not etched.

The oxygen gas may be provided in order to suppress the removal of the first and second masks 54 and 56 during the etching process using the ammonia gas. The oxygen gas may be reacted with surfaces of the first and second masks 54 and 56 to form an oxide layer 57 thereon. The oxide layer 57 may have a lower etching rate that that of the first and second masks 54 and 56, and thus the oxide layer 57 may prevent the first and second masks 54 and 56 from being removed during the etching process.

When the oxygen gas is provided excessively, the phase change pattern 52a may be also oxidized. Therefore, a flow rate of the oxygen gas may be adjusted to oxidize the surface of the first and second masks 54 and 56 while suppressing the oxidation of the phase change pattern 52a.

When the flow rate of the oxygen gas is higher than about 10% of that of the ammonia gas, the phase change pattern 52a may be also oxidized by the oxygen gas. Further, in this case, the oxygen gas may hinder the etching of phase change pattern 52a. Therefore, the oxygen gas may be provided at a flow rate less than 10% of that of the ammonia gas.

Etching conditions for etching the phase change layer 52 may be as follows. The etching process may be performed at a temperature of about 10° C. to about 300° C. and under a pressure of about 1 mTorr to about 10 mTorr. A micro-wave power of about 700 W to about 1500 W and R.F. bias power of about 200 W to about 700 W may be applied in the etching process.

If a halogen gas, e.g. chlorine gas or fluorine gas, is used for etching the phase change layer 52, etching rates of elements included in the phase change layer 52 may be different from one another due to reactivity differences of the elements. Accordingly, a composition ratio of the phase change layer 52 may change greatly in the etching process. When the ratio of a specific element included in the phase change pattern 52a is substantially increased or decreased, the phase change pattern 52a may have poor phase change characteristics, and further the phase change pattern 52a may collapse because the coherence of the elements therein may become weak.

However, in accordance with example embodiments, the reactivity between the ammonia gas and the elements of the phase change layer 52 may be substantially the same as, or very similar to one another. Thus, the composition ratio of the phase change layer 52 may be maintained substantially constant even after the etching process. Accordingly, the phase change pattern 52a may have good phase change characteristics and an enhanced sidewall profile.

If the phase change layer 52 is etched by a conventional etching process, the phase change pattern 52a may be damaged by an etching gas including fluorine gas or chlorine gas that may remain on the surface of the phase change pattern 52a even after the etching process. Therefore, the phase change pattern 52a may have a poor reliability. However, when the phase change layer 52 is etched using ammonia gas in accordance with example embodiments, the surface of the phase change pattern 52a may be protected by nitrogen remaining on the surface of the phase change pattern 52a. Therefore, the phase change pattern 52a may not be damaged by the remaining etching gas. Accordingly, the phase change pattern 52a may have a good reliability.

If the phase change layer 52 is etched by a conventional physical etching process, the composition ratio of the phase change layer 52 may not be changed during the etching process. However, the sidewall profile of the phase change pattern 52a may not be uniform. Additionally, when the phase change patterns 52a are formed to have a narrow gap therebetween, there may be lower portions of the phase change layer 52 that are not etched.

In accordance with example embodiments, the phase change layer 52 is not etched by a physical etching process, and thus the phase change pattern 52a may have a narrow pitch and good sidewall profile.

Furthermore, the oxygen gas may be provided during the etching process so that the first and second masks 54 and 56 may be prevented from being damaged. Therefore, the phase change pattern 52a having a desirable shape may be formed and a characteristics distribution thereof may be reduced.

FIGS. 25 to 28 are cross-sectional views illustrating a method of manufacturing a phase change memory device in accordance with example embodiments.

An etching process illustrated with reference to FIGS. 23 and 24 may be used for manufacturing the phase change memory device.

Figure 25:
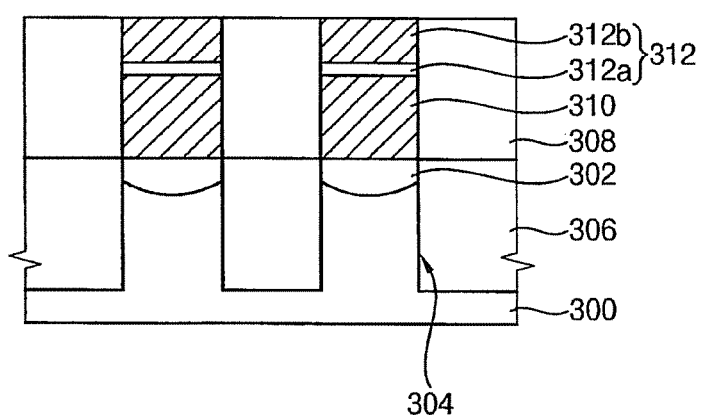
FIGS. 25 to 28 are cross-sectional views illustrating a method of manufacturing a phase change memory device in accordance with example embodiments.

Referring to FIG. 25, an impurity region 302 may be formed by implanting, for example, n-type impurities onto an upper portion of a substrate 300. An upper portion of the substrate 300 may be partially etched to form a plurality of trenches 304 in a second direction, each of which may extend in a first direction perpendicular to the second direction. An isolation layer may be formed on the substrate 10 to fill the trench 304, and an upper portion of the isolation layer may be planarized to form an isolation layer pattern 306 in the trench 304.

A first insulating interlayer 308 may be formed on the substrate 300 and the isolation layer pattern 306. A first opening (not shown) exposing the impurity region 302 may be formed by partially etching the first insulating interlayer 308. A silicon layer may be formed on the first insulating interlayer 308 and the impurity region 302 to fill the first opening, and an upper portion of the silicon layer may be planarized to form a silicon layer pattern partially filling the first opening.

An upper portion of the silicon layer pattern may be implanted with p-type impurities, and a lower portion of the silicon layer pattern may be implanted with n-type impurities to form a diode 310 in the first opening.

A pad electrode 312 having a metal silicide layer 312a and a metal layer 312b sequentially stacked thereon may be formed to fill a remaining portion of the first opening.

Figure 26:
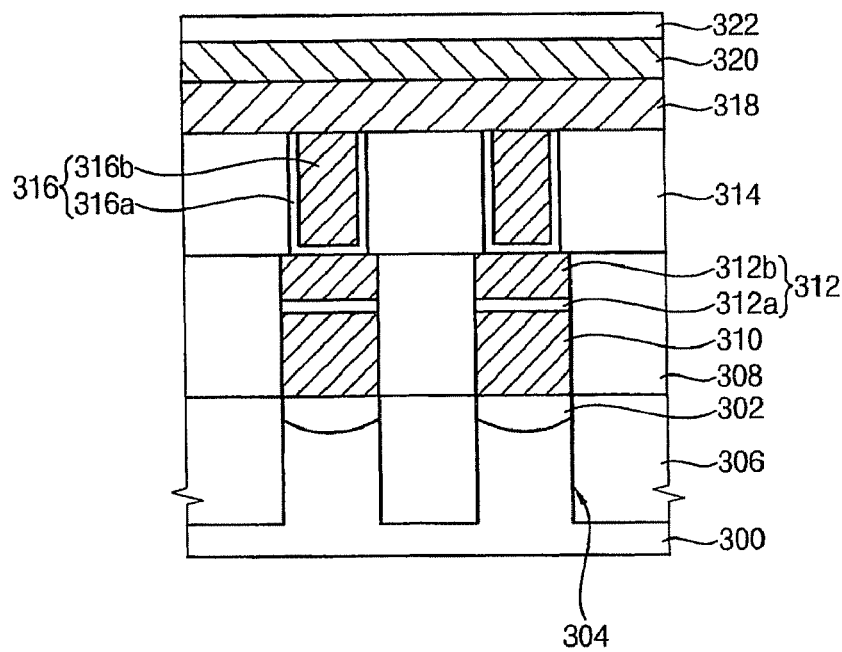
Figure 27:
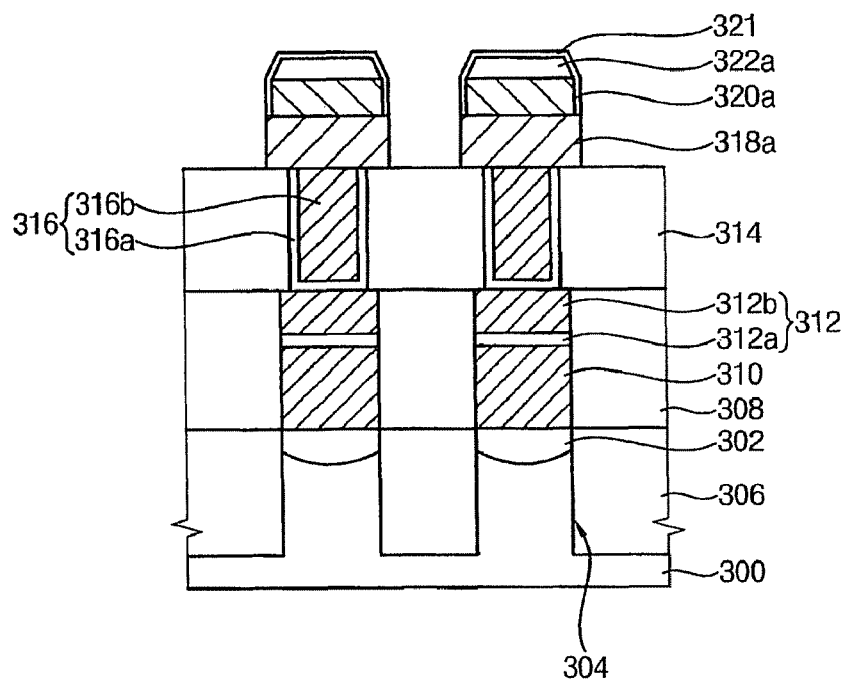

Referring to FIG. 26, a second insulating interlayer 314 may be formed on the first insulating interlayer 308 and the pad electrode 312. The second insulating interlayer 314 may be partially etched to form a second opening (not shown) exposing a top surface of the pad electrode 312.

A lower electrode contact 316 may be formed on the top surface of the pad electrode 312 to fill the second opening. Particularly, a barrier layer may be formed on an inner wall of the second opening and the second insulating interlayer 314. A metal layer may be formed on the barrier layer to fill a remaining portion of the second opening. The barrier layer may be formed using titanium, titanium nitride, etc. These may be used alone, or in a combination thereof. The metal layer may be formed using tungsten, aluminum, copper, etc. Upper portions of the metal layer and the first barrier layer may be planarized until a top surface of the second insulating interlayer 314 is exposed to form the lower electrode contact 316 including a barrier layer pattern 316a and a metal layer pattern 316b sequentially stacked on the pad electrode 312.

A phase change layer 318 may be formed on the second insulating interlayer 314 and the lower electrode contact 316. The phase change layer 318 may be formed using an alloy including at least three of Ge, Sb, Te, In, and Bi. The phase change layer 318 may be formed using GST, but example embodiments are not limited thereto. The phase change layer 318 may be formed by a physical vapor deposition (PVD) process, a chemical vapor deposition (CVD) process, a sol-gel process, an atomic layer deposition (ALD) process and a cyclic chemical vapor deposition (cyclic CVD) process, etc.

An upper electrode layer 320 may be formed on the phase change layer 318. The upper electrode layer 320 may be formed using titanium nitride, but example embodiments are not limited thereto. A hard mask layer 322 may be formed on the upper electrode layer 320. The hard mask layer 322 may be formed using silicon nitride, but example embodiments are not limited thereto.

Referring to FIG. 25, a hard mask 322a may be formed by patterning the hard mask layer 322. An upper electrode 320a may be formed by patterning the upper electrode layer 320 using the hard mask 322a as an etching mask. The hard mask 322a may be formed to have a line width of about 30 nm to about 100 nm.

The phase change layer 318 may be etched using the upper electrode 320a and the hard mask 322a as an etching mask. Particularly, the phase change layer 318 may be etched by a plasma reactive etching process using ammonia gas as an etching gas together with oxygen gas to form a phase change pattern 318a. The etching process for forming the phase change pattern 318a may be substantially the same as that illustrated with reference to FIG. 24.

A composition ratio of the phase change pattern 318a may be substantially the same as that of the phase change layer 318. The phase change pattern 318a may not have an etching damage in the etching process and may have a good vertical profile. Additionally, even though a plurality of the phase change patterns 318a is formed to have a narrow gap therebetween, there may be no lower portion of the phase change layer 52 that is not etched.

An oxide layer 321 may be formed on surfaces of the hard mask 322a and the upper electrode 320a by the oxygen gas.

The hard mask 322a may be hardly removed during the etching process so that the phase change pattern 318a may be formed having a desirable line width, a sidewall profile and a small characteristics distribution.

Figure 28:
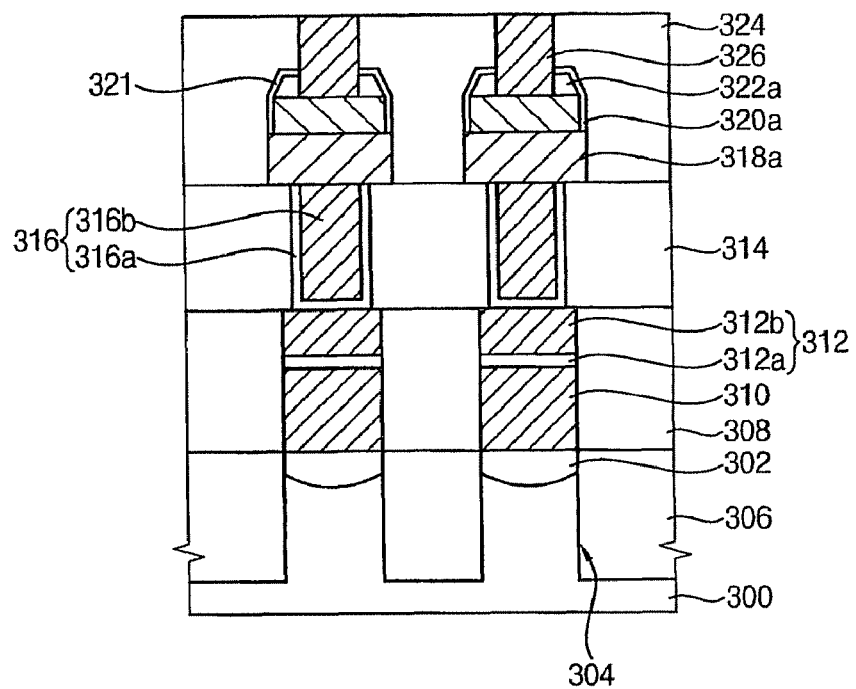

Referring to FIG. 28, a third insulating interlayer 324 may be formed on the second insulating interlayer 314 to cover the hard mask 322a, the upper electrode 320a and the phase change pattern 318a.

A contact hole may be formed through the third insulation layer 324 and the hard mask 322a to expose a top surface of the upper electrode 320a. A conductive layer may be formed on the top surface of the upper electrode 320a and the third insulation layer 324 to fill the contact hole, and an upper portion of the conductive layer may be planarized to form an upper electrode contact 326 in the contact hole. The conductive layer may be formed using a metal such as tungsten, but example embodiments are not limited thereto. A wiring (not shown) may be further formed on the upper electrode contact 326.

As described above, the phase change memory device having a good reliability and a high degree of integration may be manufactured in accordance with example embodiments.

Figure 29:
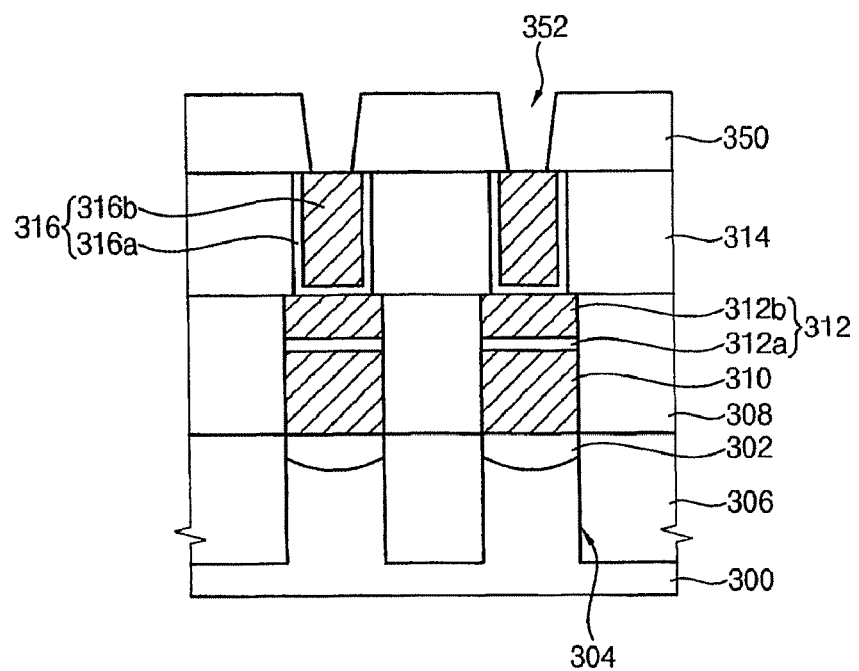
FIGS. 29 to 31 are cross-sectional views illustrating a method of manufacturing a phase change memory device in accordance with example embodiments.
Figure 30:
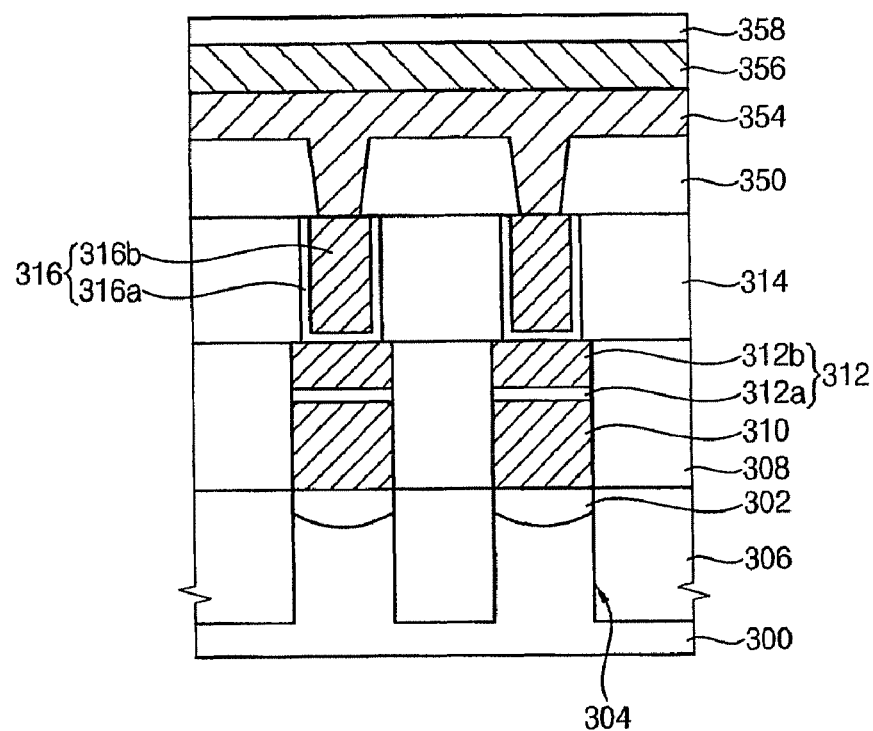
Figure 31:
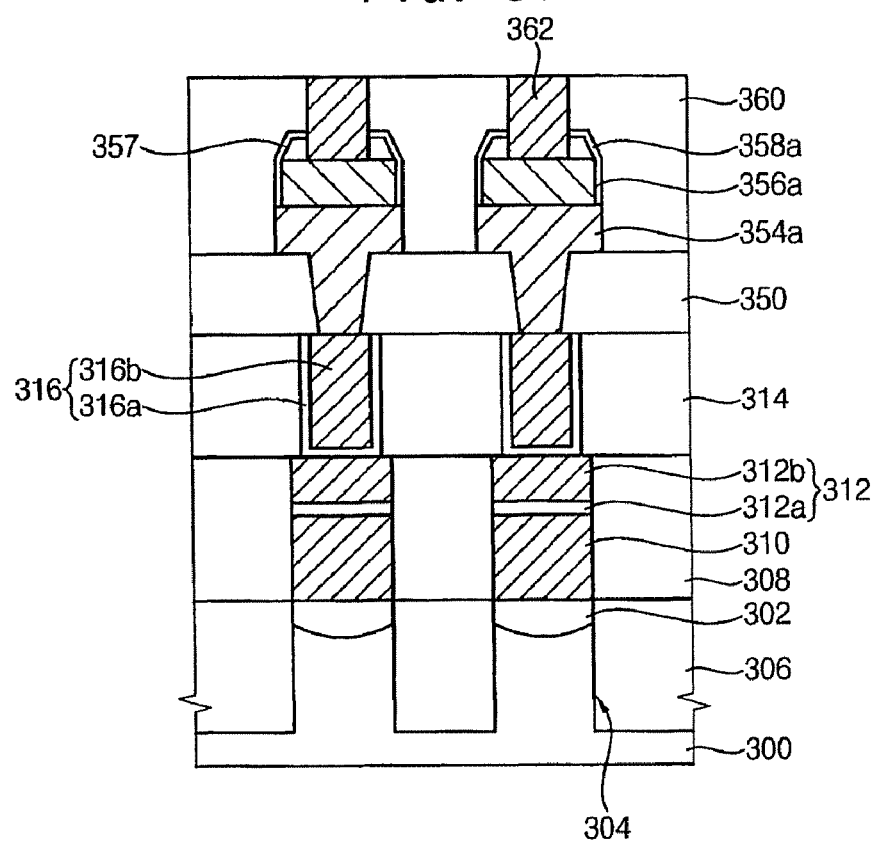

FIGS. 29 to 31 are cross-sectional views illustrating a method of manufacturing a phase change memory device in accordance with example embodiments.

An etching process described with reference to FIGS. 25 and 26 may be used for manufacturing a phase change memory device in accordance with the example embodiments.

A process illustrated with reference to FIG. 25 may be performed.

Referring to FIG. 29, a second insulating interlayer 314 may be formed on a first insulating interlayer 308 and a pad electrode 312. A lower electrode contact 316 contacting a top surface of the pad electrode 312 may be formed through the second insulating interlayer 314.

A third insulating interlayer 350 may be formed on the second insulation layer 314 and the lower electrode contact 316. The third insulating interlayer 350 may be formed using a silicon oxide, particularly, using a silicon oxide having a high density. For example, the third insulating interlayer 350 may be formed using a high density plasma (HDP) silicon oxide.

The third insulation layer 350 may be partially etched to form an opening 352 exposing a top surface of the lower electrode contact 316. The opening 352 may have an inclined sidewall so that a width of the opening 352 may become smaller from an upper portion to a lower portion. In this case, a contact area of the lower electrode contact 316 with a phase change pattern formed in a subsequent process may be decreased.

Referring to FIG. 30, a phase change layer 354 may be formed on the third insulating interlayer 350 to fill the opening 352. An upper electrode layer 356 may be formed on the phase change layer 354. A hard mask layer 358 may be formed on the upper electrode layer 356.

Referring to FIG. 31, the hard mask layer 358 may be patterned to form a hard mask 358a. The upper electrode layer 356 may be patterned to form an upper electrode 356a.

The phase change layer 354 may be etched using the upper electrode 356a and the hard mask 358a as an etching mask to forth a phase change pattern 354a. Particularly, the phase change layer 354 may be etched by a plasma reactive etching process using ammonia gas together with oxygen gas. The oxygen gas may be used for suppressing a removal of the hard mask 358a during the etching process. The etching process may be substantially the same as that illustrated with reference to FIG. 24.

A fourth insulating interlayer 360 covering the upper electrode 356a may be formed on the third insulating interlayer 350. Additionally, an upper electrode contact 362 may be formed through the fourth insulating interlayer 360. A wiring (not shown) may be foamed on the upper electrode contact 362.

Hereinafter, a method of forming phase change patterns in accordance with example embodiments may be illustrated with reference to FIGS. 22 to 24. The method is substantially the same as that illustrated with reference to FIGS. 22 to 24, except for conditions of an etching gas.

Particularly, processes illustrated with reference to FIGS. 22 to 23 may be performed to form a phase change layer 52, a first mask 54 and a second mask 56 as shown in FIG. 23.

A phase change pattern 52a may be formed by performing a plasma reactive etching process on the phase change layer using ammonia gas, oxygen gas and an assistance etching gas. The oxygen gas may be provided at a flow rate lower than about 10% of that of the ammonia gas. Examples of the assistance etching gas may include $CF_4$, carbon monoxide (CO), hydrogen bromide (HBr), $SF_6$, etc. These may be used alone, or in a mixture thereof. An inert gas may be further provided during the etching process. Examples of the inert gas may include argon (Ar) or helium (He), etc. An etching condition in the etching chamber may be controlled by providing the inert gas.

A shape of the phase change pattern 52a may be controlled by providing the inert gas. A flow rate of the inert gas may be controlled considering a width and a height of the phase change pattern 52a, a gap between the phase change patterns 52a and a sidewall slope of the phase change pattern 52a, etc. Additionally, an etching rate of the phase change layer may be also controlled by adjusting the flow rate of the assistance gas.

The etching process may be performed at a temperature of about 10° C. to about 300° C. and under a pressure of about 1 mTorr to about 10 mTorr. A micro-wave power of about 700 W to about 1500 W and R.F. bias power of about 200 W to about 700 W may be applied in the etching process.

In accordance with example embodiments, no element of Ge, Sb and Te included in the phase change layer 52 may be etched faster than other elements therein. Every element included in the phase change layer 52 may be etched at substantially the same rate. Therefore, a composition ratio of the phase change layer 52 may be maintained substantially constant in the etching process. Particularly, an etching damage may be reduced on the phase change layer during the etching process.

Additionally, even though an area of the phase change layer to be etched is very narrow, an etching rate may not be decreased. Accordingly, the phase change patterns may have a good vertical profile and a narrow pitch.

A phase change memory device may be manufactured using the etching process according to example embodiments.

In an example embodiment, after performing the process illustrated with reference to FIGS. 25 and 26, a phase change layer may be etched by the etching process according to the example embodiments to form a phase change pattern. A phase change memory device in FIG. 28 may be manufactured by performing a process illustrated with reference to FIG. 28.

In another example embodiment, after performing processes illustrated with reference to FIGS. 29 and 30, a phase change layer may be etched by the etching process of the example embodiments to form a phase change pattern. A phase change memory device in FIG. 31 may be manufactured by performing a process illustrated with reference to FIG. 31.

Figure 32:
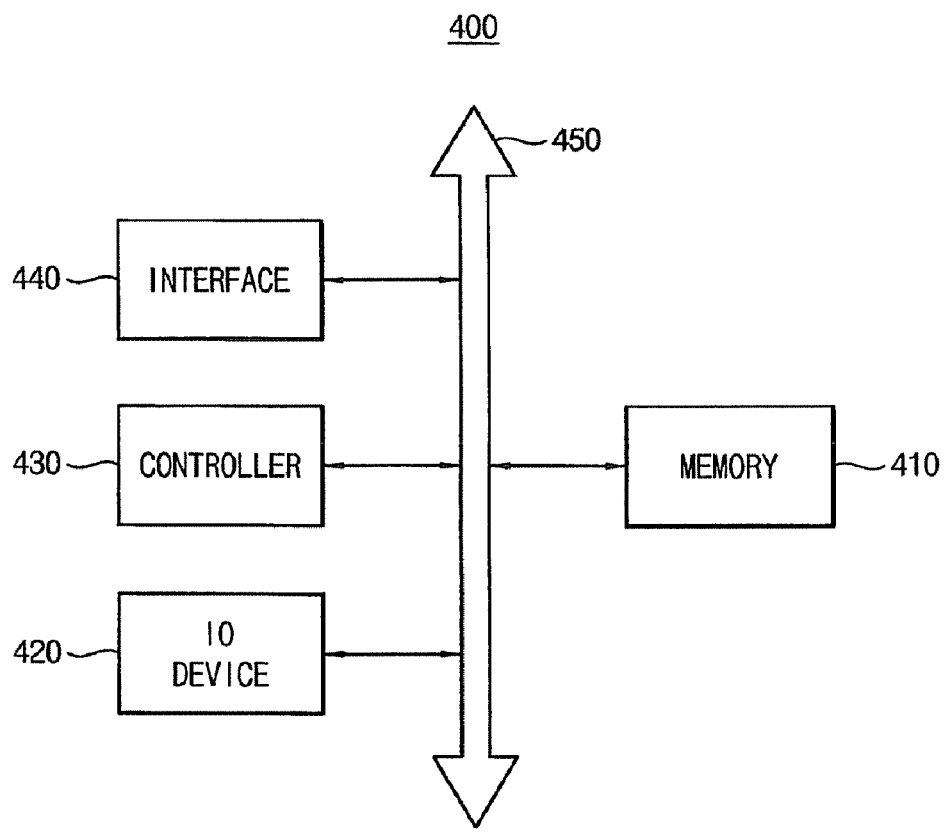
FIG. 32 is a block diagram illustrating a memory system including memory devices in accordance with example embodiments.

FIG. 32 is a block diagram illustrating a memory system in accordance with example embodiments.

Referring to FIG. 32, a system 400 includes a controller 430, an input/output (IO) device 420, a memory 430, an interface 440, and a bus 450. The system 400 may include a mobile system (e.g., a personal data assistance (PDA), a portable computer, a web tablet, a wireless phone, a mobile phone, a digital music player, or a memory card). In example embodiments, the system 400 can be any system transmitting and/or receiving information. The controller 430 may include, for example, a microprocessor, a digital signal processor, or a microcontroller. The I/O device 420 may include a keypad, keyboard or display. The memory 430 can include, for example, a DRAM or a flash memory, and/or a magnetic memory device or a phase change memory device according to example embodiments. The memory 430 can store commands executed by the controller 410. The memory 430 and the interface 440 can be combined by the bus 450. The system 400 can use the interface 440 to transmit data into a communication network or to receive data from the communication network.

Figure 33:
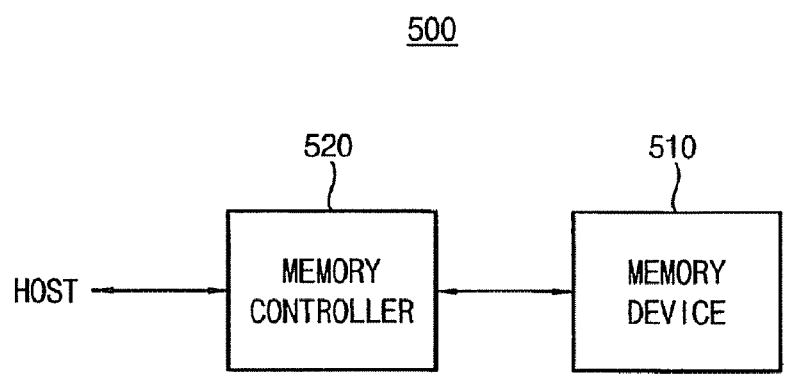
FIG. 33 is a block diagram illustrating a memory card including a semiconductor device in accordance with example embodiments.

FIG. 33 is a block diagram illustrating a memory card in accordance with example embodiments.

Referring to FIG. 33, the memory card 500 includes a memory controller 520 and a memory device 510 electrically connected to the memory controller 520. The memory device 510 may include non-volatile or volatile memory device. The memory device 510 may include a magnetic memory device or a phase change memory device in accordance with example embodiments. The memory controller 520 may provide an input signal into the memory device 510 to control the reading and the erasing operations of the memory device 510. For example, various signals (e.g., command (CMD), address (ADD), input/output data (DQ) or a high-voltage (VPP) signal) may be applied to the memory controller 520. The memory controller 520 may control the memory device 510 based on the applied various signals.

Foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the example embodiments of the inventive concepts. Accordingly, all such modifications are intended to be included within the scope of the example embodiments of the inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming a pattern structure, comprising:
   forming a magnetic layer including at least one magnetic material on a substrate;
   forming a hard mask including a metal on the magnetic layer; and performing a plasma reactive etching process on the magnetic layer using a mixed etching gas including a fluorine containing gas, ammonia ($NH_3$) gas, and oxygen gas to form a magnetic pattern, the oxygen gas suppressing the removal of the hard mask during the etching process.

2. The method of claim 1, wherein the magnetic layer includes an alloy of at least two of cobalt (Co), iron (Fe), terbium (Tb), ruthenium (Ru), palladium (Pd), platinum (Pt), manganese (Mn), iridium (Ir), and combinations thereof.

3. The method of claim 1, wherein the fluorine containing gas includes at least one of sulfur hexafluoride ($SF_6$), nitrogen trifluoride ($NF_3$), silicon tetrafluoride ($SiF_4$), carbon tetrafluoride ($CF_4$), and combinations thereof.

4. The method of claim 1, wherein a flow rate of the ammonia gas is equal to or greater than a flow rate of the fluorine containing gas.

5. The method of claim 4, wherein a flow rate ratio between the fluorine containing gas and the ammonia gas is in a range of about 1:1 to about 1:50.

6. The method of claim 4, wherein a flow rate of the oxygen gas is less than about 10% of a flow rate of the ammonia gas.

7. The method of claim 1, wherein the oxygen gas is provided at a flow rate of about 10 sccm to about 100 sccm.

8. The method of claim 1, wherein the hard mask includes at least one of titanium, titanium nitride, tantalum, tantalum nitride, tungsten, tungsten nitride, and combinations thereof.

9. The method of claim 1, wherein a metal oxide layer is formed on a surface of the hard mask during the etching process.

10. The method of claim 1, further comprising:
performing a subsequent process in which oxygen gas is provided after performing the plasma reactive etching process.

11. The method of claim 1, wherein the magnetic pattern is formed to have a line width of about 30 nm to about 100 nm.

12. The method of claim 1, wherein the plasma reactive etching process is performed at a temperature of about 10° C. to about 300° C. and under a pressure of about 1 mTorr to about 10 mTorr.

13. The method of claim 1, wherein a flow rate of the oxygen gas is adjusted so that a surface of the hard mask is oxidized during the etching process and the oxygen gas does not hinder the etching of the magnetic layer.

* * * * *